(12) United States Patent
Ortabasi

(10) Patent No.: US 6,689,949 B2
(45) Date of Patent: Feb. 10, 2004

(54) CONCENTRATING PHOTOVOLTAIC CAVITY CONVERTERS FOR EXTREME SOLAR-TO-ELECTRIC CONVERSION EFFICIENCIES

(75) Inventor: Ugur Ortabasi, Encinitas, CA (US)

(73) Assignee: United Innovations, Inc., San Marcos, CA (US)

( * ) Notice: Subject to any disclaimer, the term of this patent is extended or adjusted under 35 U.S.C. 154(b) by 0 days.

(21) Appl. No.: 10/151,640

(22) Filed: May 17, 2002

(65) Prior Publication Data

US 2003/0213514 A1 Nov. 20, 2003

(51) Int. Cl.$^7$ ............................................. H01L 31/052
(52) U.S. Cl. .................. 136/246; 136/247; 136/262; 136/252; 136/244; 257/432; 257/436; 257/443; 60/641.8
(58) Field of Search .................. 136/246, 257, 136/262, 252, 244; 257/432, 436, 443; 60/641.8

(56) References Cited

U.S. PATENT DOCUMENTS

| | | | | |
|---|---|---|---|---|
| 4,313,024 A | * | 1/1982 | Horne | 136/253 |
| 5,409,550 A | * | 4/1995 | Safir | 136/246 |
| 5,560,700 A | * | 10/1996 | Levens | 362/558 |
| 5,763,519 A | | 6/1998 | Springsteen | |
| 5,902,417 A | * | 5/1999 | Lillington et al. | 136/246 |
| 6,057,505 A | | 5/2000 | Ortabasi | |
| 6,333,458 B1 | * | 12/2001 | Forrest et al. | 136/259 |
| 6,469,241 B1 | * | 10/2002 | Penn | 136/246 |
| 6,515,217 B1 | * | 2/2003 | Aylaian | 136/246 |

OTHER PUBLICATIONS

Carol R. Lewis et al., Multi Band Gap High Efficiency Converter (Rainbow), proceedings from the National Center for Photovoltaics, Denver, Colorado, Apr. 16–19, 2000.

\* cited by examiner

Primary Examiner—Alan Diamond
(74) Attorney, Agent, or Firm—David W. Collins

(57) ABSTRACT

A concentrating photovoltaic module is provided which provides a concentration in the range of about 500 to over 1,000 suns and a power range of a few kW to 50 kW. A plurality of such modules may be combined to form a power plant capable of generating over several hundred megaWatts. The concentrating photovoltaic module is based on a Photovoltaic Cavity Converter (PVCC) as an enabling technology for very high solar-to-electricity conversions. The use of a cavity containing a plurality of single junction solar cells of different energy bandgaps and simultaneous spectral splitting of the solar spectrum employs a lateral geometry in the spherical cavity (where the cell strings made of the single junction cells operate next to each other without mutual interference). The purpose of the cavity with a small aperture for the pre-focused solar radiation is to confine (trap) the photons so that they can be recycled effectively and used by the proper cells. Passive or active cooling mechanisms may be employed to cool the solar cells.

28 Claims, 15 Drawing Sheets

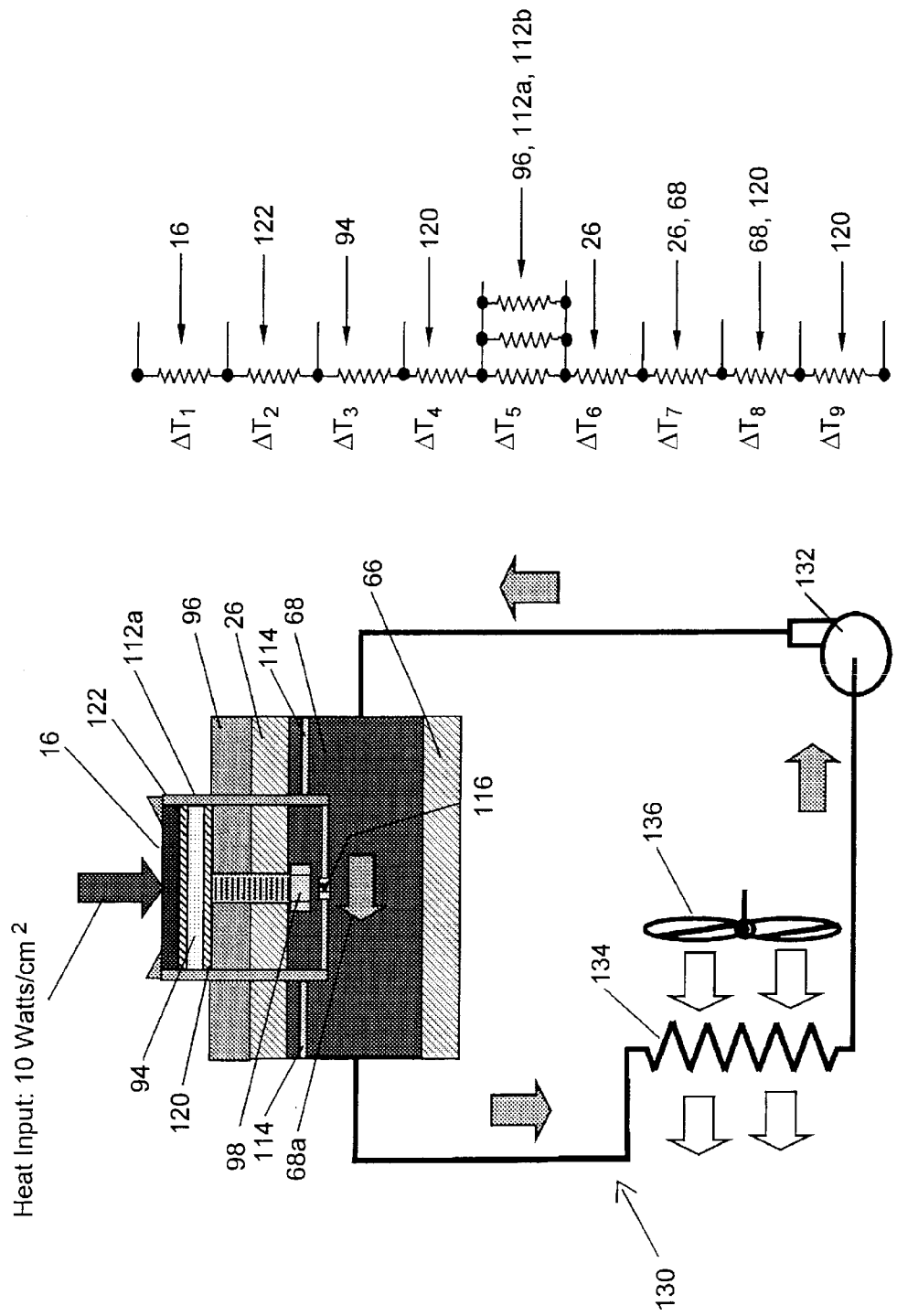

CONCENTRATING PHOTOVOLTAIC CAVITY CONVERTERS FOR EXTREME SOLAR-TO-ELECTRIC CONVERSION EFFICIENCIES

TECHNICAL FIELD

The present invention is related generally to solar power, employing photovoltaic cells, and, more particularly, to novel concentrating photovoltaic modules that achieve extremely high efficiencies.

BACKGROUND ART

State-of-the-art single junction solar arrays as well as concentrators using single junction solar cells utilize only a limited portion of the available solar spectrum, thereby wasting the remainder of available energy outside of their limited spectral response. The limitation is caused mainly by two basic "photon loss" mechanisms within the cells, namely, (1) loss by longer wavelengths and (2) loss by excess energy of photons. In the former case, photons with energy smaller than the "energy bandgap" or "forbidden gap" $E_g$ (direct bandgap semiconductor) or $E_g - E_{phonon}$ (indirect bandgap semiconductors where $E_{phonon}$ is the phonon quantum of energy) cannot contribute to the creation of electron-hole pairs. In the latter case, in the spectrum range of interest, one photon generates only one electron-hole pair. The rest of the energy larger than the bandgap is dissipated as heat. Photons with energy $h\nu > E_g$ thus can only use a portion of $E_g$ of their energy for generation of electron-hole pairs. The excess energy raises the temperature of the solar cell and degrades its performance. Thus, even high quality cells with excellent quantum efficiencies, such as GaAs, exhibit relatively modest conversion efficiencies since they cannot respond to more than a relatively small portion of the incident spectrum.

One way of circumventing this limitation is the use of two or more different bandgap cells that are stacked, or monolithically grown, in a vertical manner. Such a multi-junction (MJ) system with appropriately chosen bandgaps can span a significantly greater portion of the incident solar spectrum than achievable with single-junction cell systems. Such multi-junction solar cells are well-known. For example, three-junction cells have been devised that can control a relatively larger portion of the solar spectrum, and are further described below. Because of their potential for very high efficiencies, MJ cells have enjoyed increased interest over the last two decades.

At a recent NCPV (National Center for Photovoltaics) meeting in Denver, Colo. on Apr. 16–19, 2000, it was reported that triple-junction GaInP2/GaAs/Ge concentrator cells developed by NREL (National Research Energy Laboratory) and Spectrolab have achieved 32.3% at 47 suns and 29% at 300 suns (AM1.5, 25C), with an obvious drop of 3.3% (absolute) or 10.2% (relative), indicating one of the many limitations of MJ concentrator systems at higher concentrations. It should be kept in mind that the above-mentioned encouraging achievement with a pulsed solar simulator does not represent a real life situation. Under actual operating conditions, the MJ concentrator system performance can drop more than 12 to 15% (absolute) against the bare cell performance and defeat the use of high efficiency MJ cells. Some of the major concentration-related performance losses in MJ cells are caused by the following shortcomings: absorption of light in the top cells, chromatic aberrations caused by the concentrator optics, flux non-uniformity on the cells, limited heat removal from the top cells, current limitation in the cells, series resistance, shadowing losses due to finger contacts on the cells, and limited acceptance angle for photon incidence on the cells. Most of these limiting factors apply to all conventional concentrator types based on a variety of cells. MJ cells, however, are more vulnerable to most of these performance-limiting factors.

The relative deterioration of MJ cells becomes worse as the number of junctions increases. Several authors in the field have predicted that for vertically stacked or monolithically-grown systems, limited improvements are expected beyond triple-junction cells. A recent press release by Boeing (Spectrolab) on Aug. 15, 2001, confirmed that a triple junction cell developed by Spectrolab and NREL has reached a conversion efficiency of 34% (a world record at that time) at 400×. That appears to be very much the limit of three-junction cells. Four-junction cells are predicted to be able to reach upper 30% and lower 40% efficiencies. Theoretical studies have shown that to achieve this kind of efficiency level, a four-junction cell system requires a 1 eV bandgap III–V cell that meets all requirements including: optical, thermal, and electronic issues involved. In spite of extensive efforts, this material remains elusive.

Another shortcoming of the monolithic MJ cells lies in the limitation of complementary bandgap cell materials with matching lattices. In vertically-grown MJ cells, all the adjacent "sub-cells" must have matching or slightly mismatching lattices for proper performance. Thus, even the best bandgap matched sub-cell cannot result in a multi-junction cell if their lattices mis-match. This requirement narrows down significantly the available set of sub-cells that could be used.

These apparent limitations represent a formidable bottleneck in the development of high and very high efficiency (and therefore cost-competitive) concentrator systems in the near future. According to analytical studies, ideal four bandgap cell systems utilizing a new 1 eV material can improve the solar to electricity conversion efficiency over 48% at 500 suns. Even at a cost of $250/Watt for such a system, the effective cell system cost for a 500× flux concentrator can be as low as $0.50/Watt. At this cost level, the concentrators would be ahead of the long range goals of the Department of Energy for PV flat plate technology (installed system cost of $1.00/Watt to $1.50/Watt by the year 2030), if the balance of concentrator system could be built for $0.50/m² to $1.00/m². Thus, very high cell and system efficiencies are paramount to achieve the long term cost goals for photovoltaics in general.

In the late 1990s, NASA and JPL scientists proposed an alternative technique, called "Rainbow", to circumvent the problems of vertical MJ systems and improve the performance of multi bandgap cell systems. Their method is to split the solar spectrum into several frequency bands and focus each frequency band onto separate cells with corresponding energy bandgaps. The Rainbow multi-bandgap system represents a combination of solar cells, concentrators, and beam splitters. The use of separate discrete cells offers the widest possible scope of semiconductor choices. Based on data for "real" cells and optical components, Rainbow was expected in 1997 to convert over 40% of incident solar energy to electricity at the system level.

To the knowledge of the present inventor, this concept has never come to a closure, presumably due to extreme difficulties encountered with the associated optics. In addition, this space system would only have a concentration ratio of a maximum of 20×, i.e., much lower than the 500× or more to reduce the effective cell cost dramatically. A thorough literature search has shown that in the past, the very promising method of spectral splitting and simultaneous use of discrete solar cells with different bandgaps has never reached its potential capacity and the technology was never exploited fully. The invention disclosed herein represents a straight-forward approach to achieve break-through performance levels and with it to rapidly lower the cost of solar energy to competitive levels.

DISCLOSURE OF INVENTION

In accordance with the present invention, a photovoltaic cavity converter (PVCC) module is provided which can operate at a concentration range of about 500 to 1,000 suns and a power output range of a few kiloWatts to 50 kiloWatts when combined with a primary dish concentrator and a secondary concentrator. The disclosed PVCC module is an enabling technology to reach very high solar-to-electricity conversion efficiencies. Connecting a plurality of such modules together in a power plant permits obtaining a power generating capacity on the order of several hundred megawatts.

The PVCC module comprises:

(a) a housing having a cavity of any optimized closed shape inside the housing, the cavity having an internal surface area $A_s$ and including an opening for admitting pre-focused solar radiation into the cavity, the opening having an entrance aperture area $A_i$, where $A_i$ is smaller than $A_s$;

(b) a plurality of single junction solar cells within the cavity, at least some of the solar cells each having different energy bandgaps so their composite spectral responses simultaneously and fully span the solar spectrum; and (c) at least one wavelength filter associated with each solar cell, wherein the wavelength filter is selected from the group consisting of Rugate filters and a combination of Rugate filters and stack interference filters, thereby providing selective transmission and reflection of incident solar radiation to assist in maximizing the utilization of a region of the solar spectrum by solar cells having an appropriate bandgap.

The use of the cavity containing a plurality of single junction solar cells of different energy bandgaps and simultaneous spectral splitting of the solar spectrum provide the following improvements over the best state-of-the-art (see Table I, below), namely, high efficiency multi-junction (MJ) solar cells operating under high solar flux concentration. The improvements listed in Table I are due to the change from a vertical cell architecture of the MJ cells (where the cells that respond to different parts of the solar spectrum are stacked or monolithically grown on top of each other) to a lateral geometry within the spherical cavity (where the cell strings made of the single junction cells operate next to each other without mutual interference). The purpose of the cavity with a small aperture for the pre-focused solar radiation is to confine (trap) the photons to a high degree so that they can be recycled effectively and used by the proper cells provided with the proper "pass/reject" spectral filters, thus the name Photovoltaic Cavity Converter (PVCC).

TABLE I

COMPARISON OF A CONVENTIONAL CONCENTRATOR BASED ON VERTICALLY-STRUCTURED MULTI-JUNCTION CELLS WITH PVCC UNDER 500X OR HIGHER CONCENTRATION.

| Key Issues for Concentrators with Flux Densities ≧ 500X AM1.5 | Conventional MJ Concentrator Cells With Vertical Architecture (Prior Art) | III–V, Lateral, Single Junction Cell Systems in Spectrum-Screening* Cavity (Present Invention) |
|---|---|---|
| Cell operational temperature under high solar fluxes | Difficulty in controlling top cell temperatures at heat removal rates of over 30 W/cm² | Direct and efficient heat removal from single junction cells |
| Strong variation of flux density at cell surfaces and image movements due to structure deformation | Increased series losses Chromatic abberration losses Large grid shadowing losses | Good flux uniformity Large tolerance against image movements, Negligible grid shadowing losses |
| Continuous and long term operation at high currents | Potential for instability of tunnel junctions Current mismatch losses | Tunnel junctions are eliminated No current limitation induced by neighboring bandgap materials |
| Effectiveness of light transmission through the cell | Unwanted long wave light absorption in top cells Losses at transparent contacts between the cells | Each discrete cell is directly exposed to solar flux No transparent contacts are required |
| Material choice limitations in achieving cell efficiencies of ≧45% or to have a module efficiency of ≧38% | Lack of lattice-matched cell material systems having the optimum bandgap combinations (missing 1 eV bandgap semiconductor material) | Lattice-matching problems are eliminated by using discrete cells of different bandgap, illuminated independently |
| The need to increase number of junctions (or stack of cells) above 3 to achieve 45% or better cell efficiency | Diminishing returns in efficiency with increasing number of cells Complex manufacturing Higher cost | Much increased choice in selecting different bandgap materials Simple manufacturing Lower cost |
| Reflective losses of concentrated flux by the non-active areas between the cells | Requires very high cell packaging density with associated thermal and structural problems | Packaging is not an issue since the reflected flux from the non-active areas is recycled |

*Note: Spectral screening is a different optical process, but the end effect is equivalent to spectral splitting; i.e., photons of different wavelength are separated from each other. Screening happens via selective reflection and transmission, while splitting happens via refraction in a medium.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

FIG. 10d is a schematic diagram depicting an embodiment of a cooling system for the PVCC of the present invention, with the cells mounted on the cavity wall;

FIG. 10e depicts the thermal path for the heat flow from cell top into the coolant and rejection of heat into the ambient air via an external heat transfer loop.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

The invention herein is directed to the performance of a photovoltaic cavity converter (PVCC) module designed for a concentration in the range of 500 to over 1000 suns and a power output range of a few kilowatts to 50 $KW_e$ when combined with a primary dish and a secondary concentrator. A 1.5 KW prototype unit is presently being developed for use at the NREL High-Flux Solar Furnace (HFSF). The module herein is also expected to find use in, for example, DOE's Concentrating Solar Power (CSP) program to develop systems in the 1 to 5 $kW_e$ and 10 to 30 $kW_e$ size ranges based on reflective optics. A typical power range is about 30 to 50 kiloWatts. Connecting a plurality of such modules together in a power plant permits power generation up to several hundred megaWatts.

The novel PVCC module of the present invention is based on advanced single junction cells, including III–V cells, for example, manufactured by Emcore Photovoltaic (Albuquerque, N. Mex.). The PVCC module presently under a test program by NREL is based on reflective optics, and is capable of delivering power in the range of 0.5 to 3 $kW_e$ at concentrations in the range of 100 to 500× when optically coupled to the exit aperture of the second reflective stage (CPC) currently located at HFSF. According to NREL specifications, this second reflective stage provides an average flux density of 20,000 AM1.5 suns at its exit aperture. The overall targeted module conversion efficiency for near- and midterm is to exceed 33% to 45%, respectively.

The PVCC module of the present invention is a light-trapping cavity equipped with internal solar cells of different energy bandgaps. A unique system of Rugate filters is applied to the cells to "split" the solar spectrum by the method of selective energy extraction (spectral screening). This novel conversion device actually defocuses to a certain extent the pre-focused solar flux entering the cavity in a controllable manner by determining the diameter of the sphere.

Figure 1A:
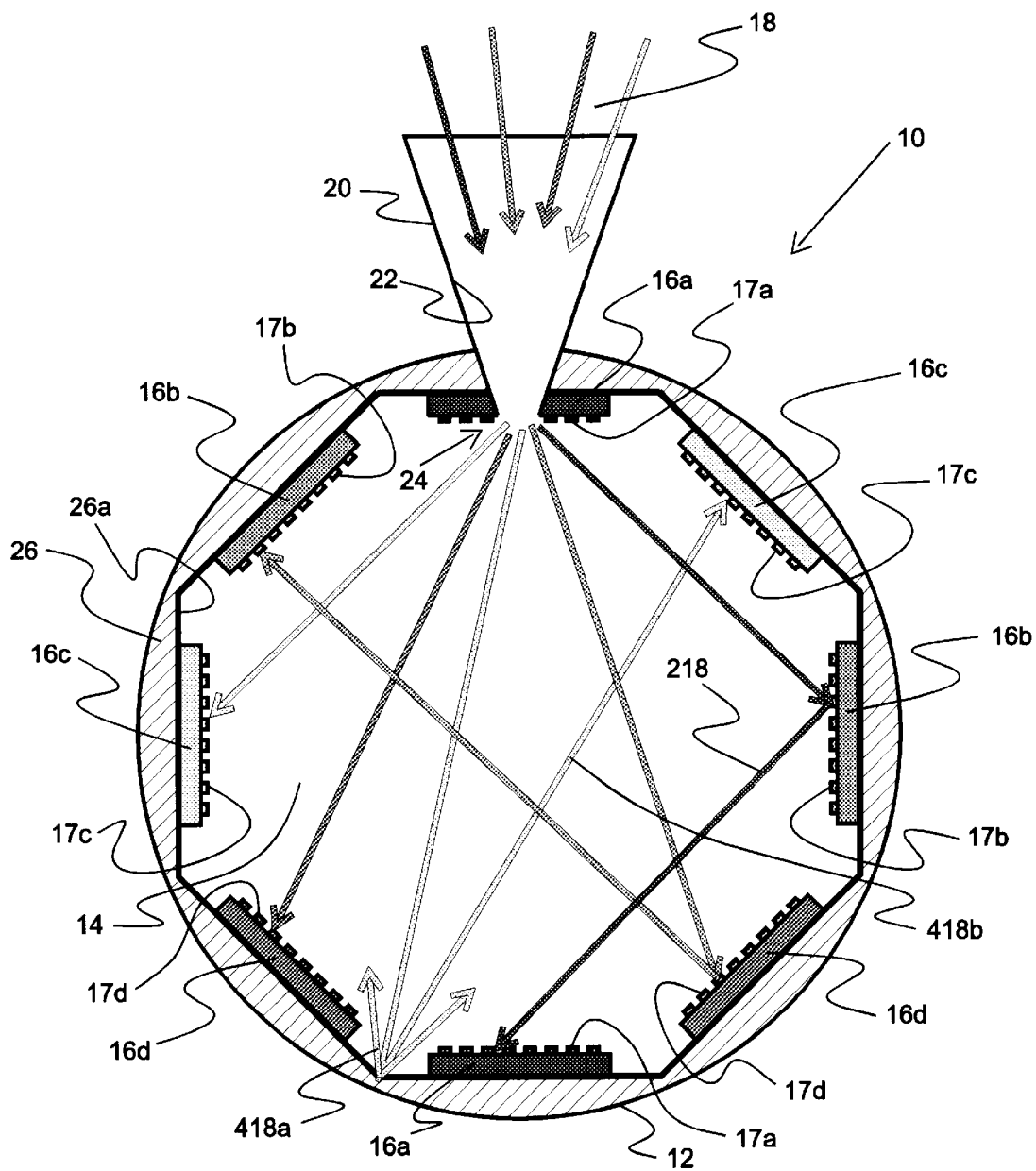
FIG. 1a is a cross-section view, in schematic, depicting the basic principles of the Photovoltaic Cavity Converter (PVCC) of an embodiment of the present invention.
Figure 1B:
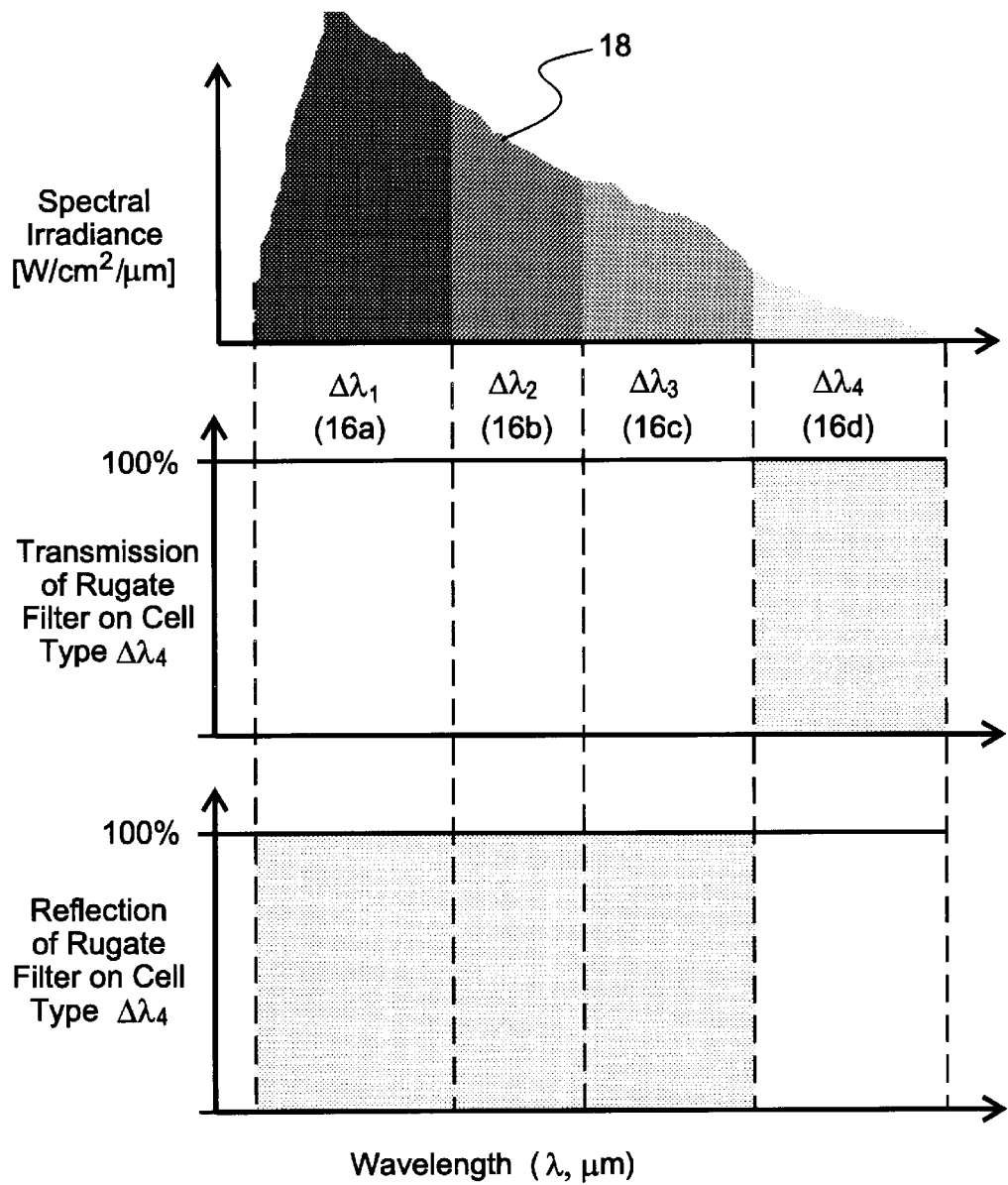
FIG. 1b is an illustration of the spectral irradiance in W/cm²/μm as a function of wavelength in μm, and depicting the transmission and reflectance of a Rugate filter on a specific cell.

FIGS. 1a–1b illustrate the principles of the Photovoltaic Cavity Converter (PVCC) of the present invention. In FIG. 1a, the PVCC 10 comprises a housing 12 having an internal cavity 14 that is generally spherical, but may be some other optimized closed shape. By an "optimized closed shape" is meant, for example, a generally spherical shape, a generally ellipsoidal shape, or a generally conical shape. In general, any shape that is closed upon itself is useful in the practice of the present invention. However, a generally spherical shape is preferably employed in the practice of the present invention. The closed shape is optimized to promote an efficiency that is as high as is possible ("optimized") in the collection of photons.

The cavity 14 contains therein a plurality of solar cells 16, grouped into voltage-matched cell strings of different energy bandgaps. Simultaneous spectral splitting occurs by means of selective transmission and/or reflection of the photons by matching (conjugated) Rugate filters 17 associated with the cells 16. In an exemplary embodiment, there are four groups of solar cells, denoted 16a, 16b, 16c, 16d, although it will be appreciated by those skilled in this art that less than four groups or more than four groups of solar cells may be employed in the practice of the present invention. In a preferred embodiment for PVCC, four or more cell types are employed, which, when properly selected, is expected to result in higher efficiencies.

Each group of solar cells 16 is responsive to a different portion of the solar spectrum 18. Examples of suitable solar cells that are responsive to different portions of the solar spectrum are discussed below.

The light 18 entering into the spherical cavity 14 is first pre-focused by a primary concentrator (dish) (not shown in FIG. 1a) and then by a second-stage concentrator 20 that has its inner surfaces 22 mirrored. An example of such a concentrator is disclosed in U.S. Pat. No. 6,057,505, issued May 2, 2000, to the present inventor. The second-stage concentrator 20 has a Bezier optimized contour to provide a combination of maximum acceptance angle, highest concentration, and minimum height.

After passing through the second-stage concentrator, the light 18 then enters the spherical cavity 14 through a small entrance aperture 24 (similar to an integrating sphere) and is defocused to the desired flux concentration by the choice of the diameter of the sphere 12. The escape probability of the trapped photons can easily be kept below a few percent by making the aperture 24 small enough as compared to the surface area of the interior wall 26. The highly reflective interior surface 26 of the sphere 12 is lined with discrete single junction cells, including III–V solar cells 16 of different energy bandgaps and/or IV solar cells, such as Si and/or Ge. Other types of cells are also permissible if they meet the performance criteria.

Photons, once trapped by the cavity 14, undergo several bounces from the cells 16 and cavity wall 26 until they are either (1) absorbed to generate waste heat or (2) transmitted into the appropriate cells to generate electron-hole pairs with a high probability or (3) escape back to space through the aperture 24. The probability of escaping through the aperture 24 is dependent to a first approximation upon the ratio $A_i/A_s$, where $A_i$ is the diameter of the aperture and $A_s$ is the diameter of the sphere 12. A small $A_i$ and a large $A_s$ means a small escape probability. Preferably, the ratio of $A_i:A_s$ is less than 0.01.

For example, diffusely-reflected $\lambda_4$ photons, denoted at 418a, 418b, are reflected from the cavity wall 26. A $\lambda_4$ photon, denoted 418b, enters a matching $\Delta\lambda_4$ solar cell 16d. As another example, $\lambda_1$ photon, denoted 218, is rejected by a $\Delta\lambda_3$ solar cell 16c, but is absorbed by solar cell 16a.

Rugate filters 17 are described in greater detail below. However, as a brief description and illustration, FIG. 1b provides an example of an ideal Rugate filter 17d associated with a $\Delta\lambda_4$ solar cell 16d: 100% of the incident solar energy in the $\Delta\lambda_4$ region is transmitted into the solar cell 16d, while 100% of the incident solar energy in the $\Delta\lambda_1$, $\Delta\lambda_2$, and $\Delta\lambda_3$ regions is reflected away from the solar cell 16d. Each solar cell 16a–16d is provided with its own set of conjugate Rugate filters 17a–17d that are associated with the wavelength region of the solar spectrum to which that solar cell is responsive.

Figure 2:
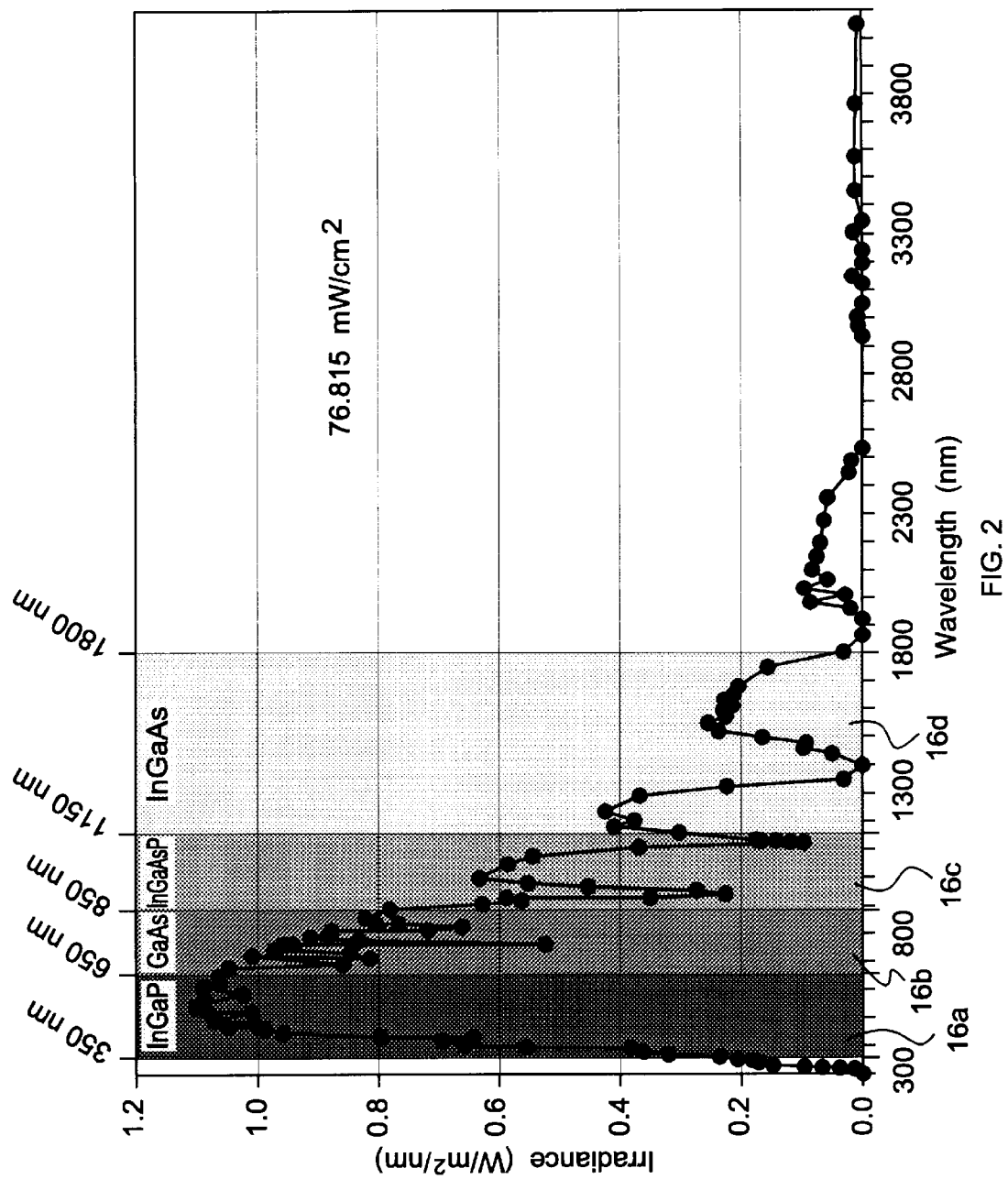
FIG. 2, on coordinates of irradiance (in W/m²/nm) and wavelength (in nanometers), is a plot depicting the Air Mass 1.5 solar spectrum and illustrates the principle of covering the solar spectrum by use of cells of different bandgaps and spectral responses.

FIG. 2 depicts the principle of covering the solar spectrum 18 by use of cells 16a–16d of different bandgaps (spectral responses) and shows how four III–V cells with congruent spectral responses can cover the solar spectrum fully. As shown in FIG. 2, a GaInP solar cell 16a covers the region of the solar spectrum 18 from about 350 to 650 nm. A GaAs solar cell 16b covers the region of the solar spectrum from about 650 to 850 nm. An InGaAsP solar cell 16c covers the region of the solar spectrum from about 850 to 1150 nm. An InGaAs solar cell 16d covers the region of the solar spectrum from 1150 to 1800 nm. However, the four-bandgap system as depicted herein does not necessarily provide the highest possible conversion efficiency.

A higher number of different cells 16 with properly-selected bandgaps can further improve the PVCC efficiency. For example, a nine-bandgap system has been predicted by JPL to be significantly over 50%. Recent computer modeling studies by the present inventor have shown that a bandgap system consisting of InGaP, GaAs, InGaAsP, and InGaAs, with respective energy bandgaps of 1.86 eV, 1.424 eV, 1.10 eV, and 0.74 eV achieves 50.27% theoretical conversion efficiency at 100 suns and at 25° C. operational temperature, if a series resistance $R_s=0$ is assumed. The series resistance is due to the resistance of the mean path of a collected carrier to reach the external circuit. The different components of $R_s$ are: back contact resistance $R_{bc}$, bulk resistance $R_b$, emitter resistance $R_e$, front contact resistance $R_f$, top grid resistance $R_g$, and the collector bus-bar resistance $R_c$. The most significant components of the overall series resistance are $R_e$, $R_f$, $R_g$, and $R_c$. The PVCC of the present invention offers the advantage of mitigating the performance-degrading effect of these resistances, via the photon recycling process inside the cavity 14. $R_f$, $R_g$, and $R_c$ can be minimized by making the contact metallization thicker and wider and $R_g$ can be minimized by making the top grid denser with minimum "shadowing" losses by the coverage. Thus, although $R_s$ will never be zero, it is possible with the PVCC of the present invention to reduce it to achieve a conversion efficiency between 45% and 50%. Recent modeling by the present inventor shows that a four-bandgap system in the PVCC system of the present invention reaches a conversion efficiency of 48.27% if the metallization is included in the cell modeling that is optimized.

A given Rugate filter 17 (see FIGS. 1a–1b) near-perfectly transmits only the content of that spectral band that matches the spectral response of the cell 16 underneath. The rest of the photons that are reflected, i.e., rejected, by the non-matching Rugate filter continue their random walk until they strike and pass through a matching filter and are then absorbed by the respective cell 16. For the person skilled in the art, it is known that by selecting appropriately spaced bandgaps, it is possible to more efficiently convert the energy of the solar spectrum 18 into electricity. Hence, much higher solar-to-electricity conversion efficiencies are expected in comparison with any single junction cell systems. In the section where the multi-junction (MJ) cell approach and spectral splitting are compared, there is also a discussion of how spectral splitting outperforms MJ systems, particularly in concentrator applications with more than three bandgap cells.

There are several unique and critical features of this photon capture and spectral splitting design that strongly affect the performance of the PVCC. Below we discuss these parameters:

Photon Capture by the Spherical Cavity (Photon Escape Probability)

Figure 3:
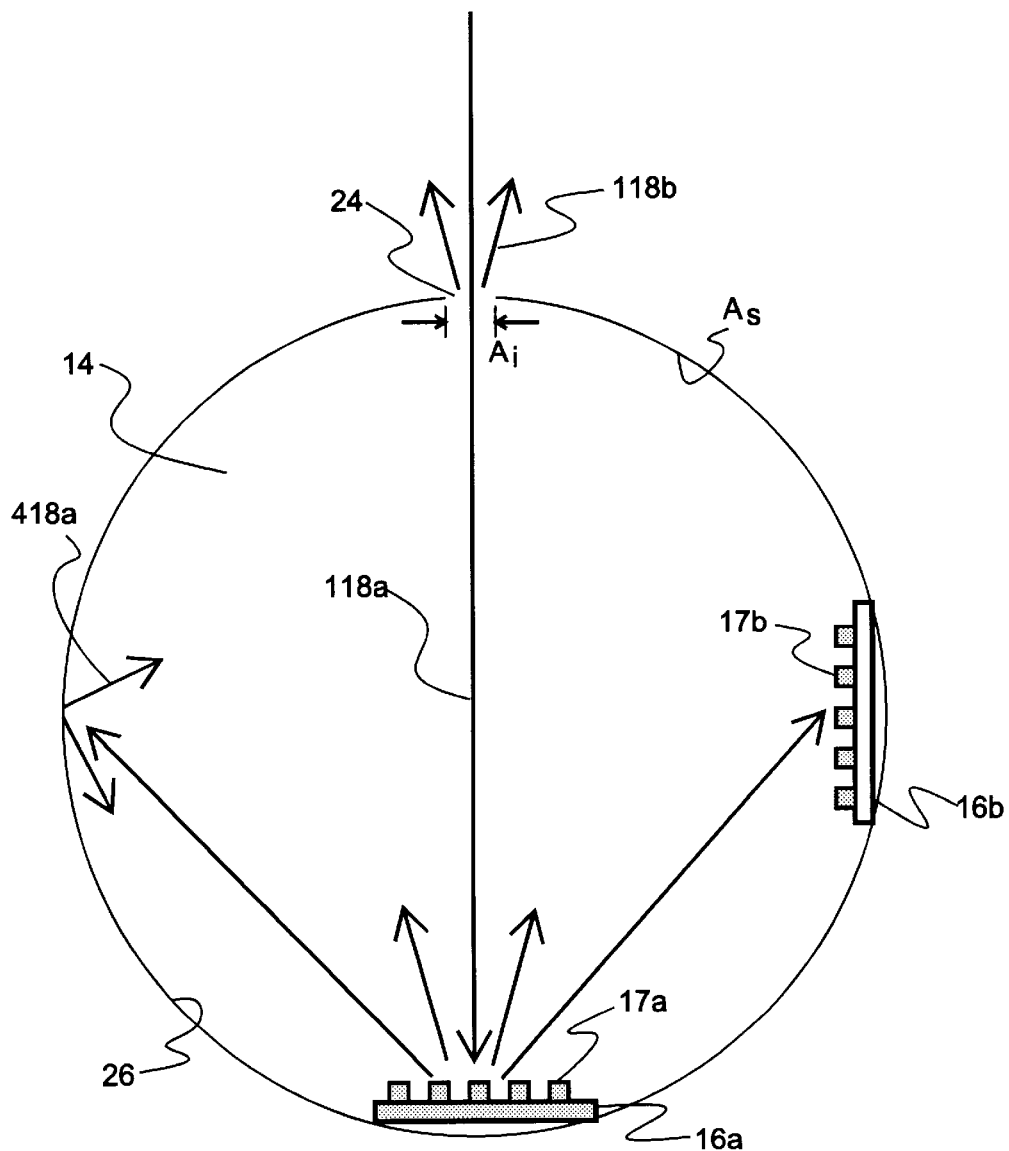
FIG. 3 is a view similar to that of FIG. 1a, depicting the escape probability of a photon representing a discrete frequency band from the PVCC of the present invention.

The highly concentrated beam (photons 18 in FIG. 1a) from the secondary concentrator 20 is injected into the spherical cavity 14 and is trapped within the boundaries of the cavity wall 26. (In actuality, the beam 18 becomes divergent after entering the cavity 14 at aperture 24.) As discussed above, the escape probability of a trapped photon representing a frequency band is, to a first degree, proportional to the ratio of entrance aperture area ($A_i$) to the total interior surface area ($A_s$) of the sphere. FIG. 3 illustrates the escape probability of a photon representing a discrete frequency band.

The incoming flux of photons is represented by 118a and the outgoing flux by 118b. The entrance aperture 24 has area $A_i$. The photon 118a can enter a solar cell 16a or be reflected off its surface and enter another solar cell 16b, or the photon can be reflected off the surface of the first solar cell 16a and in turn reflected off the interior surface 26 or reflected back through the entrance aperture 24. A Rugate filter 17, for example, 17a, is shown associated with each solar cell 16, for example, 16a. The Rugate filter 17 may be formed directly on top of the solar cells 16 or deposited on a fused glass cover and may be cemented to the cell or spaced apart from the solar cells.

Using the integrating sphere radiance equation, it can be shown that for a given frequency band the escape probability for a photon within that band is given to a first order by:

$$Q_{out}/Q_{in} = A_i/A_s \{r(1-f)/1-(1-f)\},$$

where $Q_{out}/Q_{in}$ is the ratio of the outgoing flux 118b to the incoming flux 118a, $f=(A_i+A_c)/A_s$, $A_s$=total interior surface area of the sphere 14, $A_i$=area of the entrance aperture 24, and $A_e$=total surface area of the cells 16 in the given frequency band, for example, cell 16a. This simplified equation assumes that the cells 16 (i.e., cells 16a, 16b, 16c, 16d) with bandgaps outside the frequency band have the same reflectance as the highly reflective sphere coating 26a (discussed in greater detail below). Now consider a sphere 14 of 10 cm diameter with an entrance aperture of 1.4 cm in diameter. The interior of the sphere is 20% occupied with cells of a given bandgap. All cells 16 are coated with Rugate filters 17 with complete (100%) transmission and reflection characteristics, respectively. The calculated escape probability becomes then about 1.2%. This probability can be reduced by choosing a larger diameter for the sphere 14. This, however, will lower the overall concentration ratio (see below) and increase the absorption of the photons by the uncovered cavity wall.

System Flux Concentration Ratio

Figure 4:
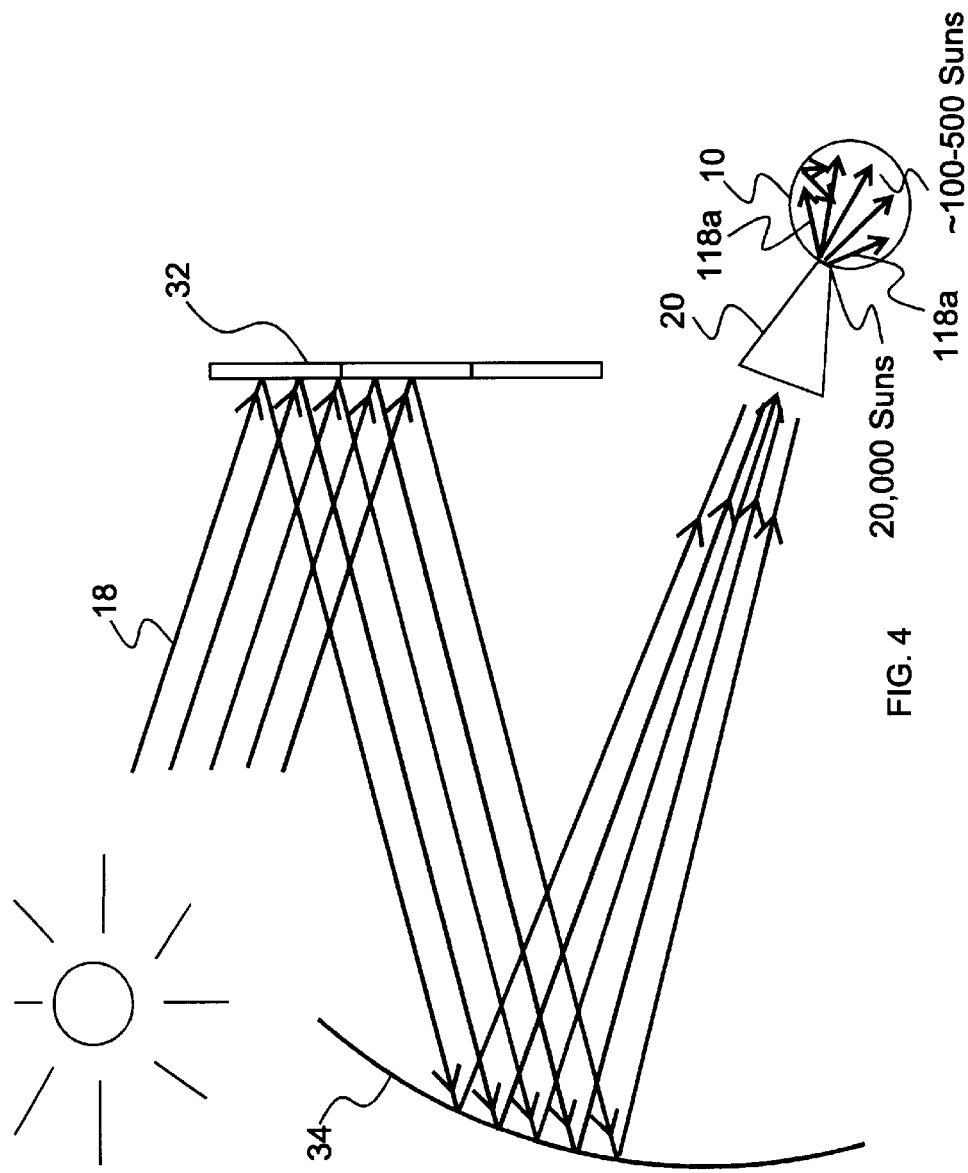
FIG. 4 is a schematic view depicting the defocusing effect of PVCC of the present invention.

FIG. 4 is a diagram of one embodiment of use, showing how the first PVCC 10 of the present invention would be coupled to the existing HFSF system at NREL. Direct solar radiation 18 (Q1) is intercepted and reflected by a flat heliostat 32 onto a dish concentrator 34. This (first stage) concentrator 34 focuses the flux onto a secondary concentrator 20 that boosts the flux concentration to Q2 at its exit. According to NREL specifications, the flux concentration ratio Q2/Q1 at the exit aperture $A_i$ of the secondary concentrator is 20,000 suns. The flux density that will be experienced by the cells 16 depends on the interior surface area 26 of the sphere 14, $A_s$. If it is assumed that the flux distribution inside sphere 14 is uniform and the photons 118a could be absorbed right after their first encounter with the interior wall surface 26, then the flux concentration experienced by the cells 16 would be simply 20,000×$A_i$/$A_s$. Preferably, $A_i$ is at least two orders of magnitude smaller than $A_s$. For the same sphere example above, this flux concentration would be about 103 suns. However, if one considers again the same sphere example, but now allows the photons 118a to have multiple reflections, then the flux concentration inside the cavity actually increases by a factor $$M = r/\{1-r(1-f)\},$$

where M is referred to as the sphere multiplier factor and is the result of multiple reflections, r is the reflection of the cavity walls 26 of the sphere 14, and f is the so-called "port fraction", i.e., the ratio of cell area in the cavity 14 divided by the total surface area of the cavity interior. If it is assumed that r=0.991 (e.g., Spectralon material 26a that will be used for the NREL experiment) and only one type of cell population that covers 30% of the cavity interior, then the sphere multiplier M becomes 3.24. Hence, the flux concentration experienced by the respective bandgap cells matching the frequency band increases by a factor of 3.24. Thus, the flux concentration of the trapped light inside the cavity becomes 333.7 suns, corresponding to a flux density of 33.37 W/cm$^2$ if a 1 sun value of 0.1 W/cm$^2$ is assumed.

Flux Uniformity

Figure 5:
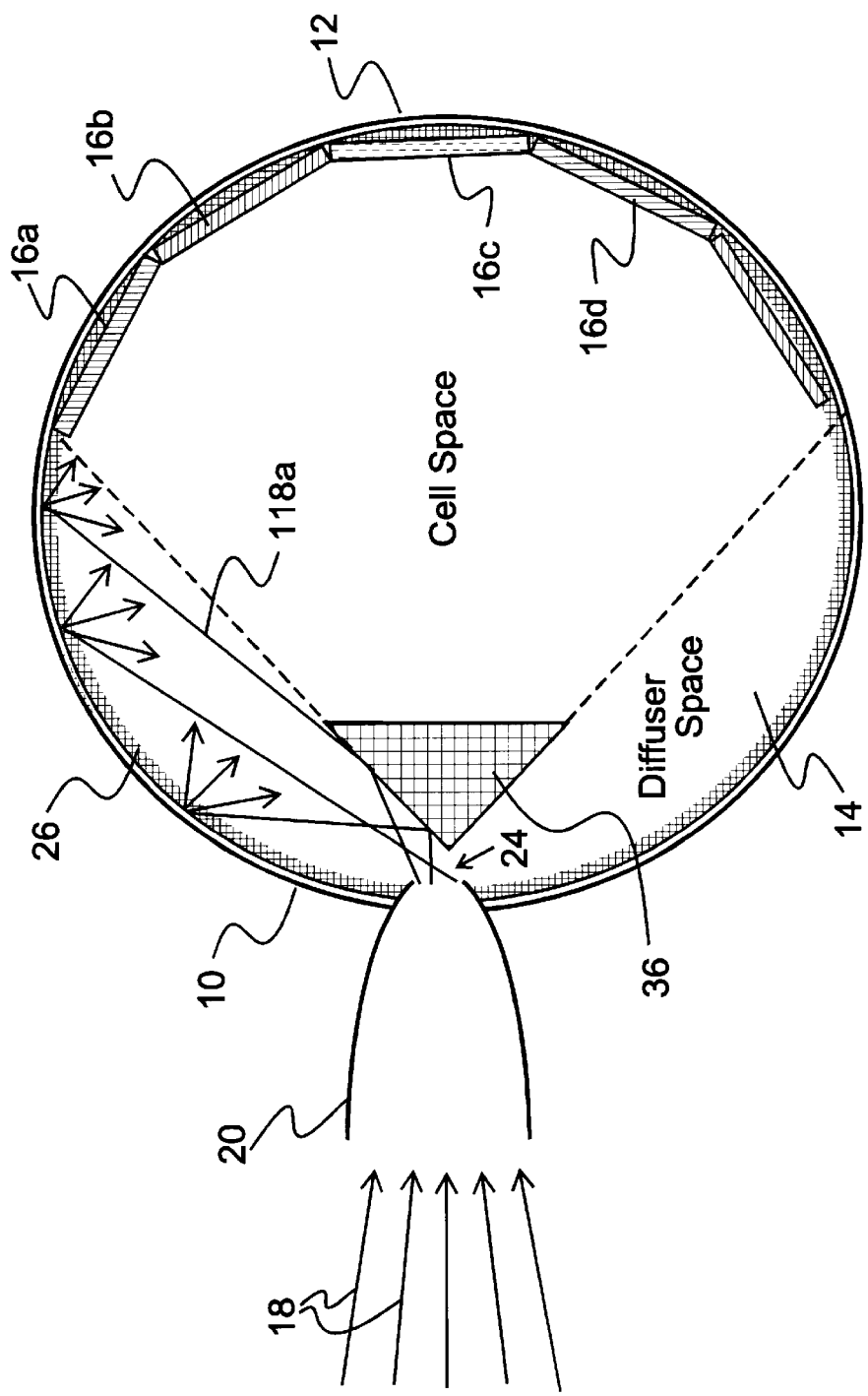
FIG. 5 depicts the shielding of cells from direct incidence of focused light and the generation of a uniform flux distribution via an internal shielding baffle inside the PVCC of the present invention.

One of the major characteristics of the PVCC 10 of the present invention is the excellent flux uniformity that is achievable within the cavity 14. The principles of this method are shown in FIG. 5.

A tapered baffle 36 inside the cavity 14 is coated with a metallic specular mirror material. As seen from the cells 16a–16d, the baffle 36 blocks the view of the entrance 24 for the flux and diverts the photons 118a towards the cavity wall 26. Thus, each photon 118a must undergo at least two reflections before it can interact with the cells 16a–16d. How quickly the directional distribution of the photons 118a at the cell surface becomes randomized depends on the number of reflections prior to impinging on the cells, the lambertian properties of the cavity wall surface 26, and the reflective characteristics of Rugate filters 17 in their rejection mode. For all analytical modeling purposes, the baffle surface as well as Rugate filter surfaces can be considered a part of the interior surface of the cavity 14, but specular reflectors in nature. Another factor that controls the quality of spatial uniformity for a given number of reflections is the port fraction (f, as defined above). The smaller this number, the better is the uniformity after a given number of reflections. At this time, it is difficult to have a quantitative number for the steady state uniformity in the cavity because the exact reflective characteristics of the Rugate filters 17 in their reflective mode as a function of photon incidence angle are not known. However, it is safe to say that for an average reflectivity better than 99%, the substantially increased surface area due to diffuser baffle 36 and the two mandatory reflections before the photons 118a enter the cell space in FIG. 5 will yield a flux uniformity of better than 90%. In other words, the uniformity of the flux density within the cell space will fluctuate within 10% of a completely uniform flux.

The Choice of Diffuse Reflector

The quality of the diffuse reflector 26a on the wall 26 of the cavity 14, shown in FIG. 1a, is of extreme importance. It is directly related to reflection losses, flux uniformity, and sphere multiplier factor M. The stability of the reflector under high levels of flux and possible, accidental temperature runaways is also very important as these may change the reflectance.

Preliminary evaluation of reflector materials 26a resulted in the selection of "space-grade" Spectralon that combines very high-reflectance with an extremely lambertian reflectance profile. It also has excellent low outgassing features. Spectralon, which is manufactured by Labsphere (North Sutton, N.H.), is a thermoplastic resin with special pigments added that can be machined into a wide variety of shapes for the construction of optical components. The material is chemically inert and is thermally stable up to 400° C. Further details of this material are disclosed and claimed in U.S. Pat. No. 5,763,519, entitled "Diffusively Reflecting Sintered Fluorinated Long-Chain Addition Polymers Doped with Pigments for Color Standard Use", and issued to A. W. Springsteen on Jun. 9, 1998, incorporated herein by reference.

Spectralon reflectance material gives the highest diffuse reflectance of any known material or coating over UV-VIS-NIR (ultraviolet-visible-near infrared) region of the spectrum. The reflectance is generally >99% over a range from 400 to 1500 nm and >95% from 250 to 2500 nm. The material is also highly lambertian at wavelengths from 250 to 10,600 nm. A "lambertian" surface is a perfectly diffusing surface having the property that the intensity of light emanating in a given direction is proportional to the cosine of the angle of the normal to the surface (lambertian cosine law). A material such as Spectralon obeying this law is said to be an isotropic diffuser that has the same radiance in all directions. "Highest diffuse reflectance" means the known highest reflectance of 99.1% over the solar spectrum. Another suitable reflectance material for use as the coating 26a in the practice of the present invention is barium sulfate.

Choice of Solar Cells

Consider a spectrum splitter that provides increments of the AM1.5 to cells 16a–16d of different bandgap, so that each cell is selectively illuminated with a narrow energy band matching its spectral response closely. The resulting band-illuminated (selectively illuminated) conversion efficiencies of each individual cell in such a spectral splitter system are much higher than they would be under a full AM1.5 spectrum. One of the highest band-illuminated cell efficiency reported in the literature is 59%, obtained with an AlGaAs/GaAs hetero-junction cell. Another literature-reported high efficiency is 50% to 55% for GaAs cells. Both tests were conducted with lasers, under intensities of 54 W/cm$^2$ and 1 W/cm$^2$, respectively (Proceedings of the IECEC, pp. 401–406 (1992)).

Figure 6:
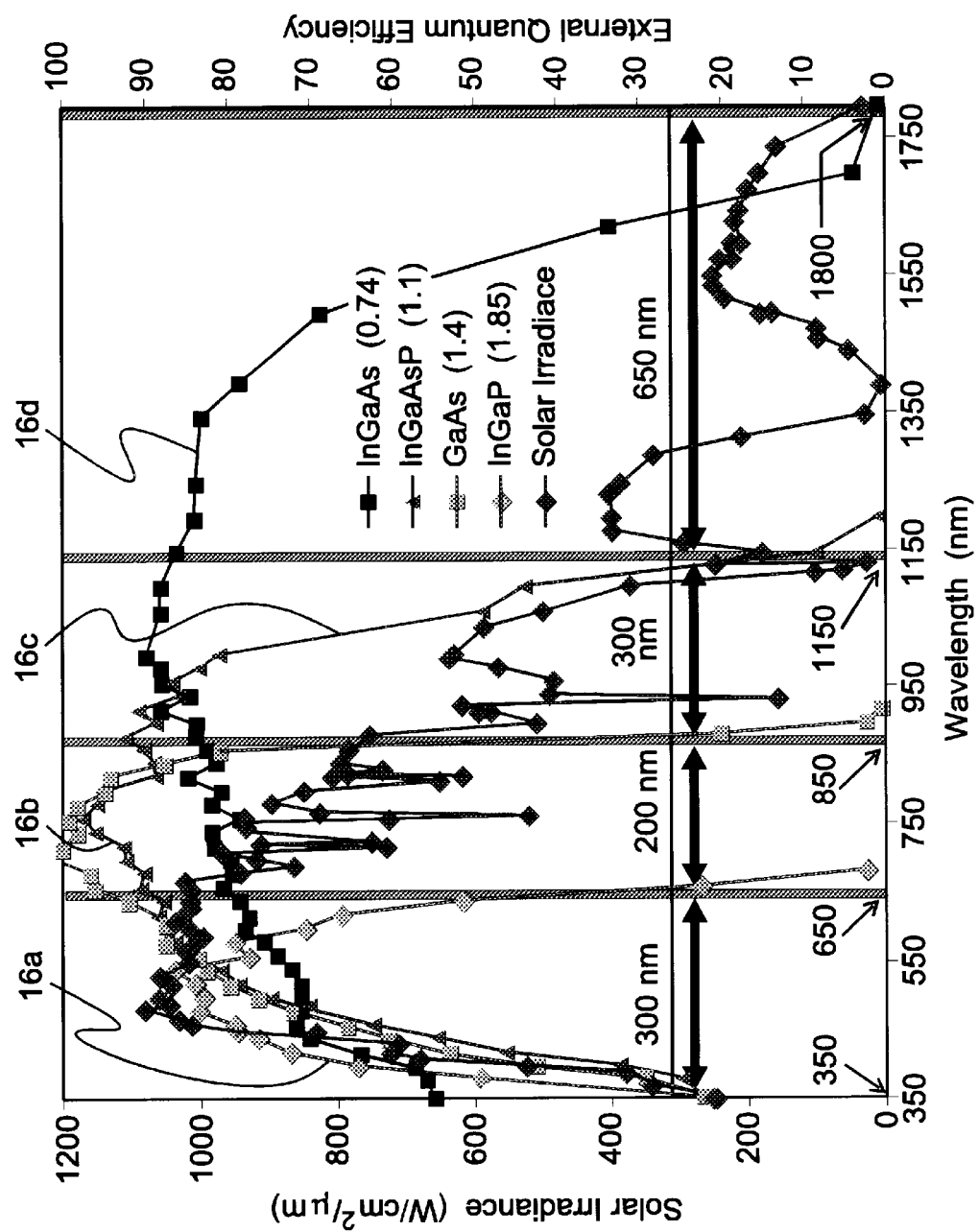
FIG. 6, on coordinates of quantum efficiency (fraction of unity) and wavelength (in micrometers), is a plot of the internal quantum efficiency for cells in a four-bandgap system in comparison with the solar spectrum (left ordinate)

FIG. 6 illustrates how the external quantum efficiencies of a four cell candidate system comprising InGaP, GaAs, InGaAsP, and InGaAs collectively covers the region of the AM1.5 solar spectrum from about 350 to 1800 nm. The vertical lines between each cell 16a–16d shows the edges of each associated Rugate filter 17a–17d transmission band. Table II below provides basic data and computed performance parameters regarding such a four energy bandgap system.

Cell Interconnects and High Current Levels and Series Resistance

One of the major advantages of the PVCC 10 of the present invention over conventional PV concentrators is the photon-trapping feature of the cavity 14. The escape probability of the trapped photons 28 from the cavity 14 can be made negligibly small by defining the ratio $A_i/A_s$ accordingly, where $A_i$ and $A_s$ have been described above. This trapping, coupled with the very high average reflectivity within the cavity 14, allows the photons 18 to undergo multiple reflections before they are absorbed. Assuming that the cell grid fingers, power bars, and the cell interconnects are also highly reflective, they can be made thicker, wider, and more dense as compared to conventional designs. The result is that their design can be optimized to minimize the series resistance that becomes the main loss mechanism when the flux density exceeds 100 to 300 suns, depending on the design. For the same reasons, shadowing losses are also minimized. Thus, the high current levels typical for concentrators are not a problem from the point of view of cell grid fingers, power bars, and interconnects.

The potential problem of interconnect failure due to thermal cycling is a major issue, given the long life expectancy (20 to 30 years) of solar systems. Preferably, the perforated Kovar (a low expansion coefficient alloy of iron, nickel, and cobalt) interconnect technology, which has been developed for space applications, is employed. This technology has been shown to survive hundreds of thousands of

TABLE II

Four Energy Bandgap System.

| Bandgap Material | InGaP | GaAs | InGaAsP | InGaAs | Total |
|---|---|---|---|---|---|
| Bandgap (eV) | 1.86 | 1.424 | 1.10 | 0.74 | — |
| Spectral Response Range (nm) | 350–650 | 650–850 | 850–1150 | 1150–1800 | 350–1800 |
| $P_{band}$ (mW/cm$^2$) | 28.04 | 17.53 | 12.92 | 11.67 | 70.16 |
| 1%, 2% optical loss | | | | | |
| Voc (mV) | 1545 | 1110 | 790 | 490 | — |
| Jsc (mA/cm$^2$) | 1110 | 1100 | 1070 | 1190 | — |
| FF (%) | 91.7 | 89.3 | 86.3 | 80.5 | — |
| Efficiency (%) | 20.46 | 14.20 | 9.50 | 6.11 | 50.27 |
| Band Irradiated Eff. (%) | 56.05 | 62.22 | 56.48 | 40.22 | — |
| Power (Watts) | 1.57 | 1.09 | 0.73 | 0.47 | 3.86 |
| 2%, 4% optical loss | | | | | |
| Voc (mV) | 1540 | 1110 | 790 | 490 | — |
| Jsc (mA/cm$^2$) | 1086 | 1092 | 1061 | 1165 | — |
| FF (%) | 91.7 | 89.3 | 86.3 | 80.4 | — |
| Efficiency (%) | 20.01 | 13.73 | 9.42 | 5.97 | 49.13 |
| Band Irradiated Eff. (%) | 54.82 | 60.16 | 56.48 | 39.30 | — |
| Power (Watts) | 1.54 | 1.06 | 0.72 | 0.46 | 3.77 |

Voltage Matching of Cells at the Module Level

Figure 7:
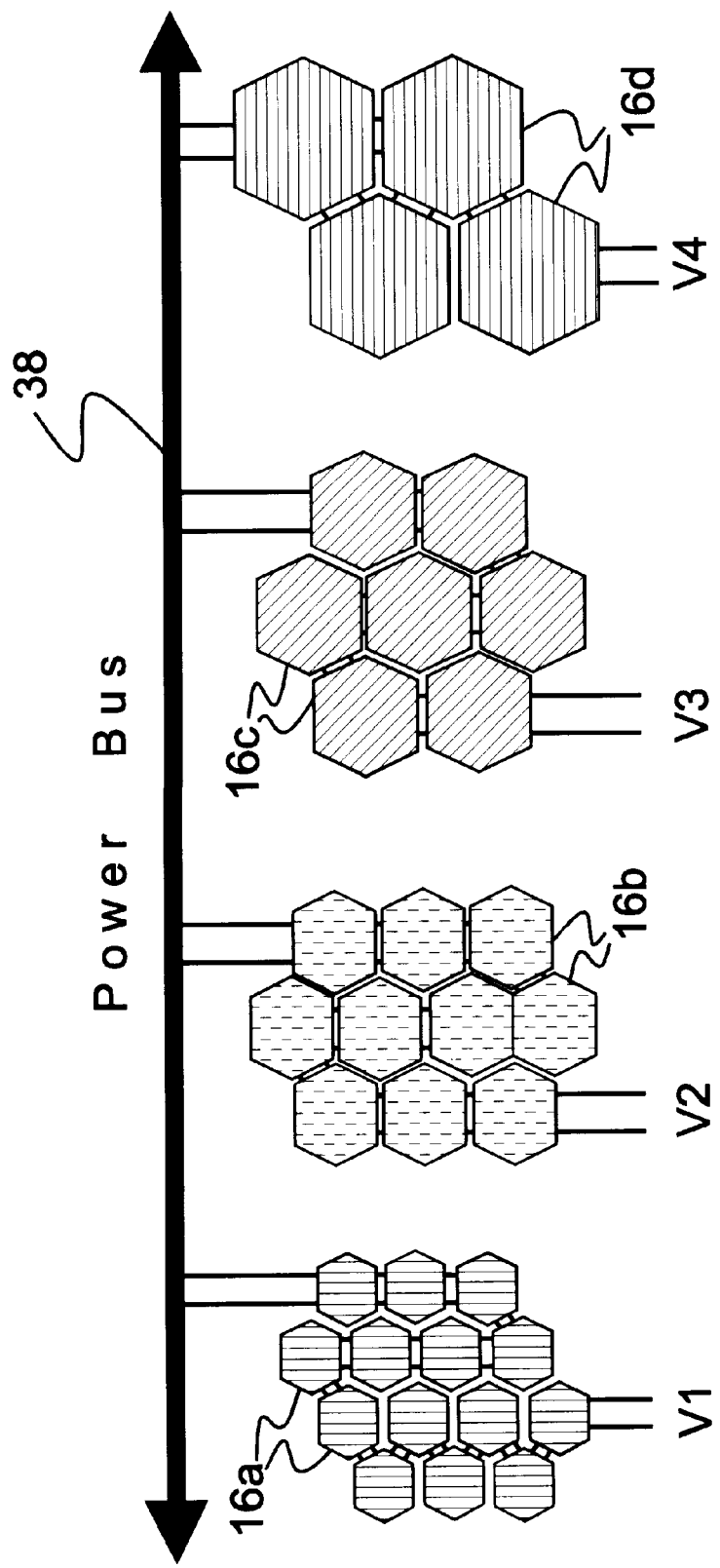
FIG. 7 is a top plan view, in schematic, depicting the principles of voltage matching of cells with different bandgaps.

In a multi-cell configuration, cells 16a–16d of different bandgaps can be either current-matched or voltage-matched. Preferably, the voltage-matched cell interconnect configuration is employed in the practice of the present invention. In such a system, cells of the same bandgap are wired into series strings. Strings of cells of different bandgaps are then wired in parallel. Each individual string provides the same output voltage. The lower bandgap cells, e.g., 16a, 16b, are each physically smaller to allow more cells in series; because their voltages are lower, they are connected into longer series strings. The configurations are shown in FIG. 7. One side of each group of cells 16a–16d is connected to a power bus 38. $V_1$ to $V_4$ are the respective open circuit voltages (Voc) which are matched within 2%.

thermal cycling in space where the temperature fluctuations can be higher than 250° C.

Rugate Filters for Spectral Splitting

As explained above, the principle of spectral splitting in a cavity 14 is selective extraction of energy contained in the different frequency bands of the solar spectrum 18. In the PVCC 10 of the present invention, this is achieved by covering cells of different bandgaps with matching Rugate filters 17 that have near-perfect reflection and transmission characteristics (see FIG. 1b, which shows the reflectance of a Rugate filter on one cell having a given bandgap and the transmittance of the same Rugate filter on the same cell). Alternatively, a combination of Rugate filters and stack interference filters may be employed in the practice of the present invention.

To achieve highly efficient selective energy extraction, the filters must satisfy the following criteria: (a) near 100% transmittance for a given frequency band and near 100% reflectance for the rest of the spectrum; (b) well-defined transmission and reflection profiles for any given band width (near-rectangular response); (c) negligible side lobes, and no higher harmonics; (d) no absorption losses; and (e) excellent stability under high solar flux levels, including UV and temperature fluctuations.

Rugate filters were developed in the last decade for pilot helmets to provide eye protection against intentionally directed laser beam attacks. Rugate filters satisfy the criteria above to a large extent. Currently available commercial optical coatings for the PVCC 10 of the present invention exhibit shortcomings that limit the photon utilization factor within the cavity. These conventional optical coatings are typically deposited using physical vapor deposition methods, such as electron beam deposition or sputter deposition. Conventional dielectric interference coatings are constructed using discrete layers of dissimilar materials deposited in a number of periods. This structure comprised of alternating layers of dissimilar materials is susceptible to stress, inter-diffusion, and possible delamination at the discrete interfaces. In addition, the spectral profile of these thin film interference filters for wide band applications as required for the present invention suffer from significant harmonic sidebands (lobes) due to constructive and destructive interference, thus degrading the optical reflection/transmission characteristics of the filter.

Figure 8:
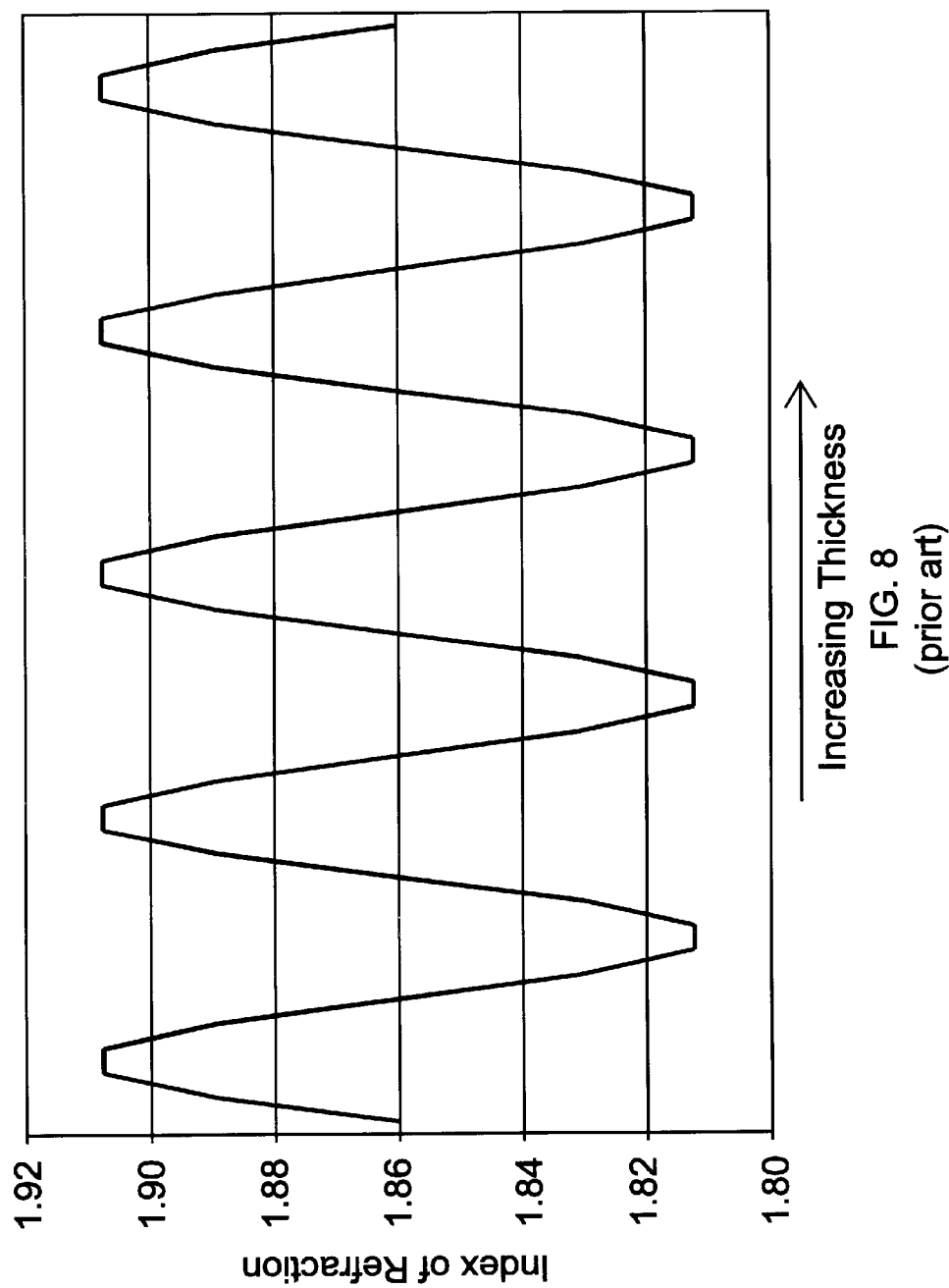
FIG. 8, on coordinates of index of refraction and increasing thickness, is a plot depicting the periodically and continuously changing index of refraction profile of a Rugate filter employed in the practice of the present invention.

These shortcomings can be eliminated with the application of Rugate filters 17a–17d. A Rugate filter 17 is an interference filter based upon a continuously varying index of refraction profile; see FIG. 8, which is a plot of index of refraction as a function of increasing thickness. The profile is continuously varying perpendicular to the plane of the surface of the substrate, following a specific geometric function, usually sinusoidal. A particular advantage the Rugate profile provides is that the rejection bandwidth can be tailored simultaneously with low insertion loss, since the Rugate filter by design suppresses harmonic sideband losses. In addition, mechanical stresses at dissimilar material interfaces are eliminated, since the structure deposited is a continuous alloy of varying composition.

Accurate Rugate filter construction utilizing a plasma enhanced chemical vapor deposition (PECVD) process has been demonstrated. This process is well-suited for forming alloys of materials with varying composition. By accurately controlling the process parameters, the optical constants of the alloy may be continuously varied in real time following a prescribed index of refraction profile. Another advantage that the Rugate filter offers is the bandwidth of the rejection region of the filter may be tailored by superposition of sinusoidal refractive index functions of different relative phases. In principal and practice, this means that the bandwidth may be designed to provide wide spectral coverage for the proposed application.

Figure 9:
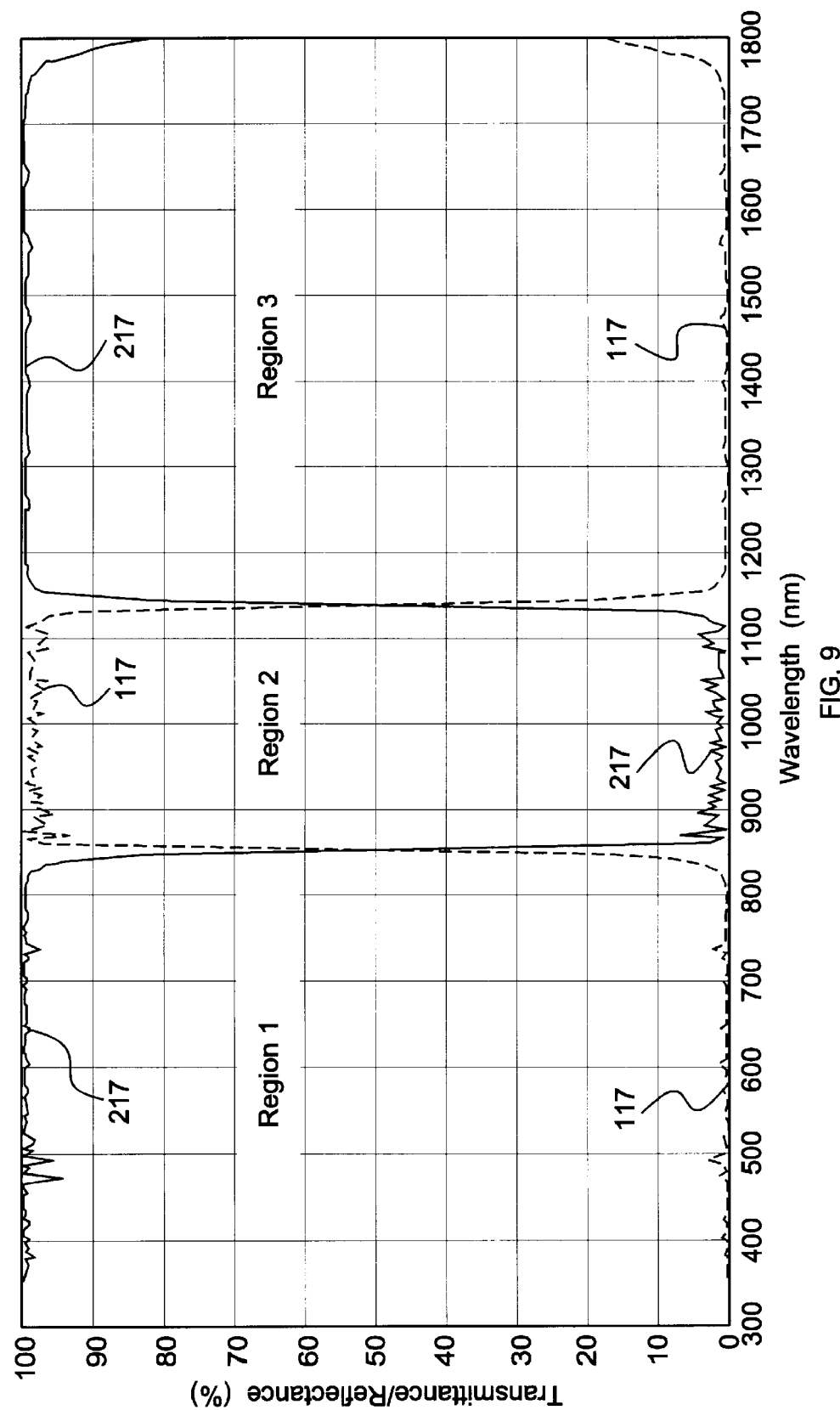
FIG. 9, on coordinates of percent transmission and wavelength (in nm), is a plot depicting, as an example, transmittance and reflectance as a function of wavelength for a Rugate filter for a specific solar cell composition, here, InGaAs.

FIG. 9 shows, as an example, a Rugate filter 17 for InGaAsP in the context of the four-bandgap system consisting of InGaP, GaAs, InGaAsP, and InGaAs that is being developed by the present inventor for the purposes of the PVCC 10. Curve 117 depicts the transmission of InGaAsP in this system, while Curve 217 depicts the reflection of InGaAsP in this system. This particular Rugate filter consists of three regions: Region 1 reflects from 350 to 850 nm (average reflectance: 99.3%), Region 2 transmits from 850 to 1150 nm (average transmittance: 98.3%), and Region 3 reflects from 1150 to 1800 nm (average reflectance: 99.0%).

The profile shown in FIG. 9 has steep ON-ramp and OFF-ramp slopes, and no higher harmonics or side lobes are present. These features support the high efficiency of the conversion process in the PVCC 10 of the present invention.

Thermal Management

III–V cells that are considered for this project have a temperature coefficient of about $0.06\%/^\circ$ C. In other words, the cell efficiency drops by 0.06% for every one degree C. increase in cell temperature. At high concentrations, the waste heat removal from the cells becomes a most critical design challenge as the heat flux densities are much higher when compared to 1 sun or no concentration cases (0.10 $W/cm^2$ vs. 30 $W/cm^2$). For example, at $90^\circ$ C. operational temperature, the cell performance of a "25% cell" drops by 4% absolute to 21% or 16% relative, both when compared to the performance of the same cell at $25^\circ$ C. Thus, a PVCC system 10 operating at 500 suns and above requires a very efficient and reliable heat management system that keeps the cell operational temperature as close as possible to the ambient.

The reliability and low maintenance features of the heat removal system are extremely important for any high concentration PV system to become a competitive technology in the distributed electric power generation market.

Figure 10A:
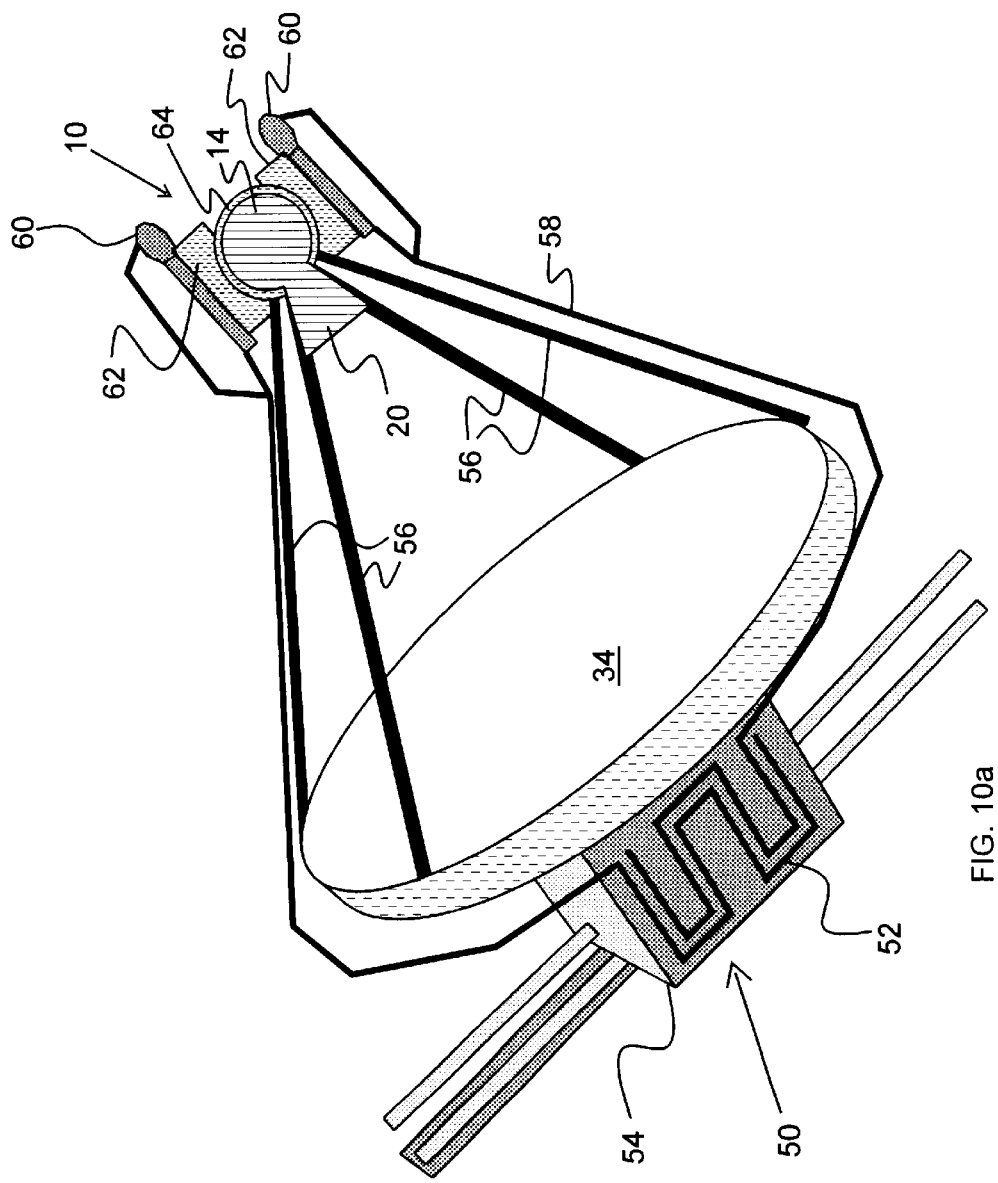
FIG. 10a is a schematic representation of one embodiment of passively cooling the PVCC of the present invention, namely, a dish concentrator/PVCC system including the associated passive thermal management system based on loop heat pipes.

Either passive cooling or active cooling of the cells 16 may be employed in the practice of the present invention. For example, FIG. 10a illustrates one embodiment of passive cooling, which requires no moving parts and which keeps the cell operational temperature as close as possible to ambient. The passive cooling system 50 employs an assemblage of heat pipes 52 that consists of spherical-, linear-, and loop-heat pipes in conjunction with a thermal heat sink 54. The PVCC 10 is suspended over the parabolic concentrator 34 by support struts 56 and is thermally connected to the heat sink 54 by loop heat pipes 58. In particular, loop heat pipes 58 are connected to loop heat pipe evaporators 60, which are in turn thermally coupled to condenser section 62 of the spherical heat pipes 64. The evaporators 60 of the loop heat pipes 58 are thermally connected to the condenser 62 of the spherical heat pipe 64.

Figure 10B:
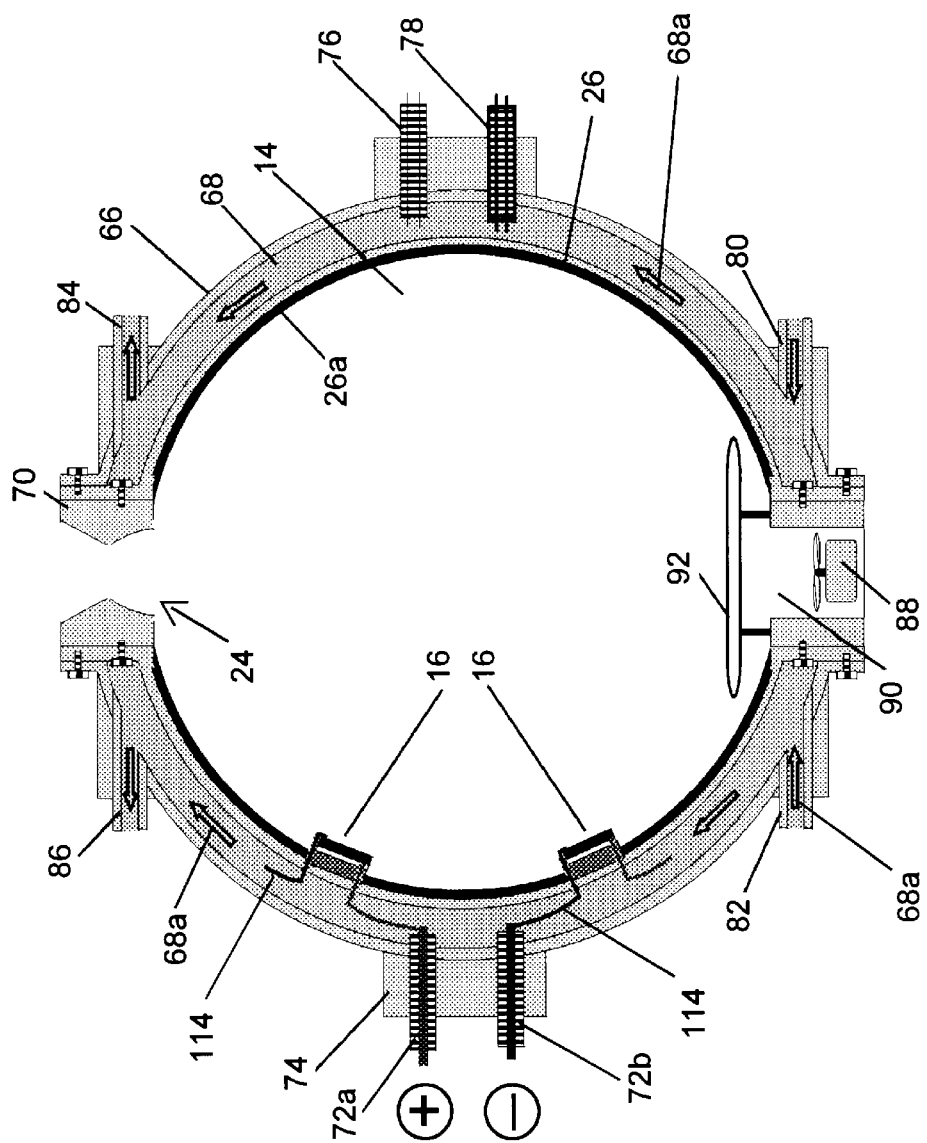
FIG. 10b is a schematic representation of one embodiment of actively cooling the PVCC of the present invention, employing forced dielectric liquid cooling to actively remove heat from the solar cells.
Figure 10C:
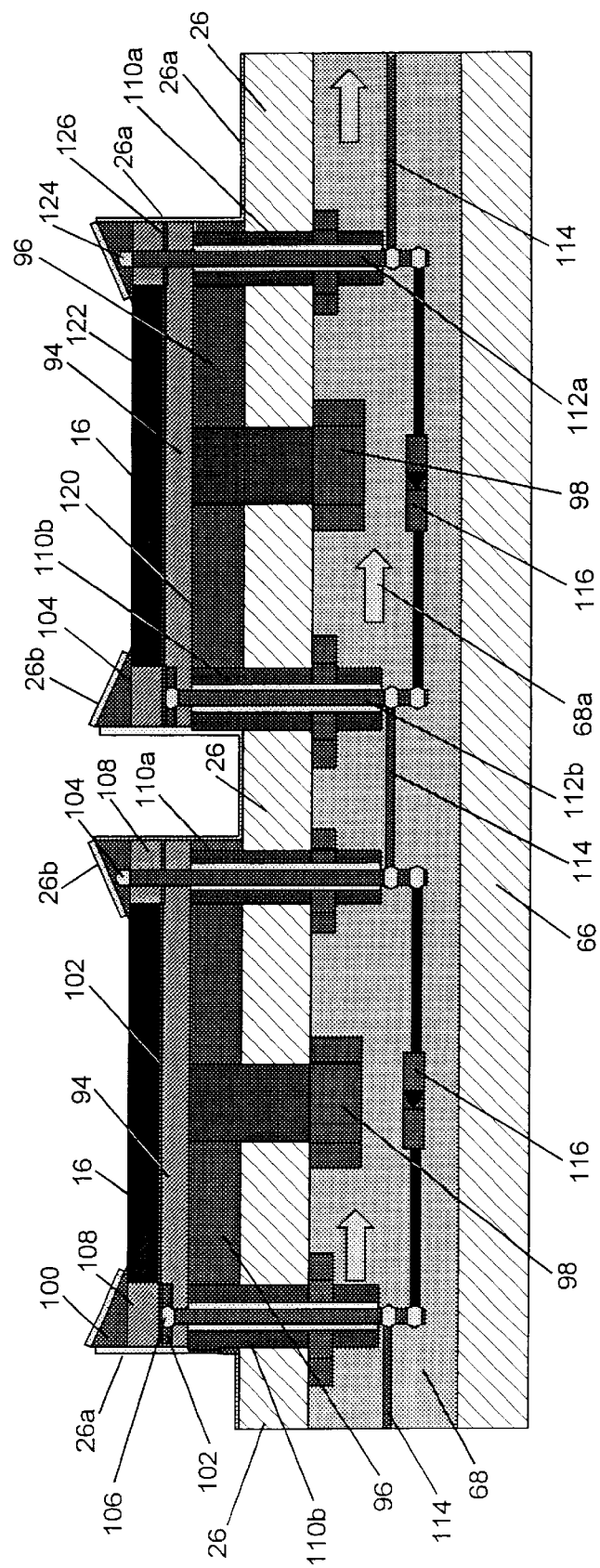
FIG. 10c is a cross-sectional view, depicting the details of one example of thermal and electric integration of the solar cells to the cavity wall of the PVCC.

Active cooling requires the circulation of a coolant around the interior cavity wall and an external cooling loop, consisting of a fan, coolant pump, and liquid-to-air heat exchanger. FIG. 10b, which is a cross-sectional view of cavity 14 and an outer coolant jacket 66, is an example of one embodiment illustrating how solar cells 16 now directly attached to the cavity wall can be cooled directly and efficiently. Cooling of the solar cells 16 (two are shown as an example in FIG. 10b) is provided by the dielectric coolant 68 that is forced by an external pump (not shown) to circulate between the inner cavity wall 26 and the removable coolant jacket 66. The waste heat to be removed by the dielectric coolant 68 is generated in the solar cells 16. FIG. 10c, described in greater detail below, shows with greater particularity how each cell 16 is mounted to the cavity wall 26.

FIG. 10b shows the solar flux port 24 which allows the concentrated solar radiation to enter the cavity 14. The inner cavity 14 and coolant jacket 66 hemispheres are bolted to a meridianal flange 70 that provides a light-tight and hermetic seal and also structural support. Electrical output from the array of solar cells 16 is provided by positive lead 72a and negative lead 72b, which are connected to the "plus and "minus" feed-through terminals located on the terminal block 74 attached to the outer wall of the cooling jacket 66. Items 76 and 78 are electrical feed-throughs for a calibration cell (not shown) and a thermo-couple (not shown), respectfully, that may be used for experimental purposes.

The coolant 68 enters the jacket 66 at inlets 80, 82 and exits at outlets 84, 86. The heated coolant 68 is cooled externally by a conventional liquid-to-air heat exchanger (shown in FIG. 10d) and returned to the inlets 80, 82.

Further surface cooling of the lambertian reflector is provided by circulating air through the cavity 14, using a fan 88, which draws air in through a cooling fan port 90 at the bottom of the PVCC 10. A baffle 92 causes the incoming air to flow over the interior surface 26 of the PVCC 10, including the solar cells 16 (the Rugate filters 17 are not shown), and blocks the photons from escaping.

FIG. 10c shows the details of the thermal, structural, and electrical integration of the cells 16 to the cavity wall 26. For clarity, the Rugate filters 17 are not shown. The solar cells 16 are mounted on ceramic substrates 94 to electrically isolate them from the copper heat spreader 96 beneath them. The copper heat spreader 96 is fastened to the cavity wall 26 via a bolt 98. The top cell contact 100 and bottom cell contact 102 are soldered to the respective feed-through conductor cores at top and bottom solder joints 104 and 106, respectively. A ceramic spacer 108 electrically separates the top cell contact 100 and the bottom cell contact 102. Electric feed-throughs 110a, 110b provide support for feed-through conductor cores 112a, 112b, the former feed-through conductor core 112a electrically associated with the top cell contact 100 and the latter feed through conductor core 112b electrically associated with the bottom cell contact 102. The cell electric (cell-to-cell) interconnects 114 and by-pass diodes 116 are directly immersed in the high strength dielectric coolant fluid 68, the direction of coolant flow being indicated by arrow 68a.

The highly reflective coating 26a is formed both on the cavity wall 26 and on the side surfaces of the structure that supports each solar cell 16. Other elements shown in FIG. 10c include a solder layer 120 between the ceramic isolation substrate 94 and the heat spreader 96, a solder layer 122 between the ceramic isolation substrate 94 and the solar cell 16, a solder joint 124 between the top contact 100 and the feed-through 102, and a solder joint 126 between the ceramic isolation substrate 94 and the ceramic spacer 108.

A specular reflective coating 26b, such as enhanced and protected aluminum or silver, is formed on the top surface of the top contact 100 to aid in ensuring that photons 118a are absorbed only by the solar cells 16, and not by any other elements within the cavity 14 of the PVCC 10.

FIG. 10d illustrates the liquid cooling loop 130 for the PVCC 10 with the cells 16 mounted on the cavity wall 26. The external heat transfer loop 130 consists of a pump 132 that forces the coolant 68 through the jacket 66 and around the cavity 14, a liquid-to-air heat-exchanger 134, and a fan 136 that cools the heat exchanger with forced ambient air.

FIG. 10e shows the thermal path for the heat to flow from cell top into the coolant 68. Specifically, FIG. 10e shows the thermal path how the waste heat generated in the top layers of the cells 16 flows through subsequent layers of the structure. It is important to note that the copper heat spreader 96 butted against the cavity wall 26, the top contact feed-through 110a, bottom contact feed-through 110b, and the respective conductor cores 112a, 112b provide parallel thermal paths to minimize the thermal resistance. The thermal path involves nine different temperature changes ($\Delta T$). The first ($\Delta T_1$) is across the solar cell 16 itself; the second ($\Delta T_2$) is across the solder interface 122 between the solar cell 16 and the ceramic substrate 94; the third ($\Delta T_3$) is across the ceramic substrate 94; the forth ($\Delta T_4$) is across the solder interface 120 between the ceramic substrate 94 and the heat spreader 96; the fifth ($\Delta T_5$) is across the heat spreader 96, as well as across the electrical feed-through conductor cores 112a, 112b (all three in parallel); the sixth ($\Delta T_6$) is across the cavity wall 26; the seventh ($\Delta T_7$) is across interface between the cavity wall 26 and the coolant 68; the eighth ($\Delta T_8$) is at the interface between the coolant 68 and the heat exchanger wall interface; and the ninth ($\Delta T_9$) is at the interface between the heat exchanger and air. $\Delta T_9$ is a boundary layer resistance, which is not visible physically and thus is not visible in FIG. 10d.

The thermal path from the cell 16 to the coolant 68 is three-fold: a first is via the copper heat spreader 96 and the cavity wall 26; a second is via the bolt 98 that is used to tighten the heat spreader 96 to the cavity wall 26; and the third is the electrical (metal) contacts 100, 102 from the top and bottom of the cell, respectively. The tightening bolt 98, top contact feed-through 112a, bottom contact feed-through 112b, and the electrical interconnects 114 from cell to cell are immersed directly into the dielectric coolant 68 that maintains voltage differences because of its high electric strength (56 kV at 25° C. and 0.08 inch gap).

Figure 11:
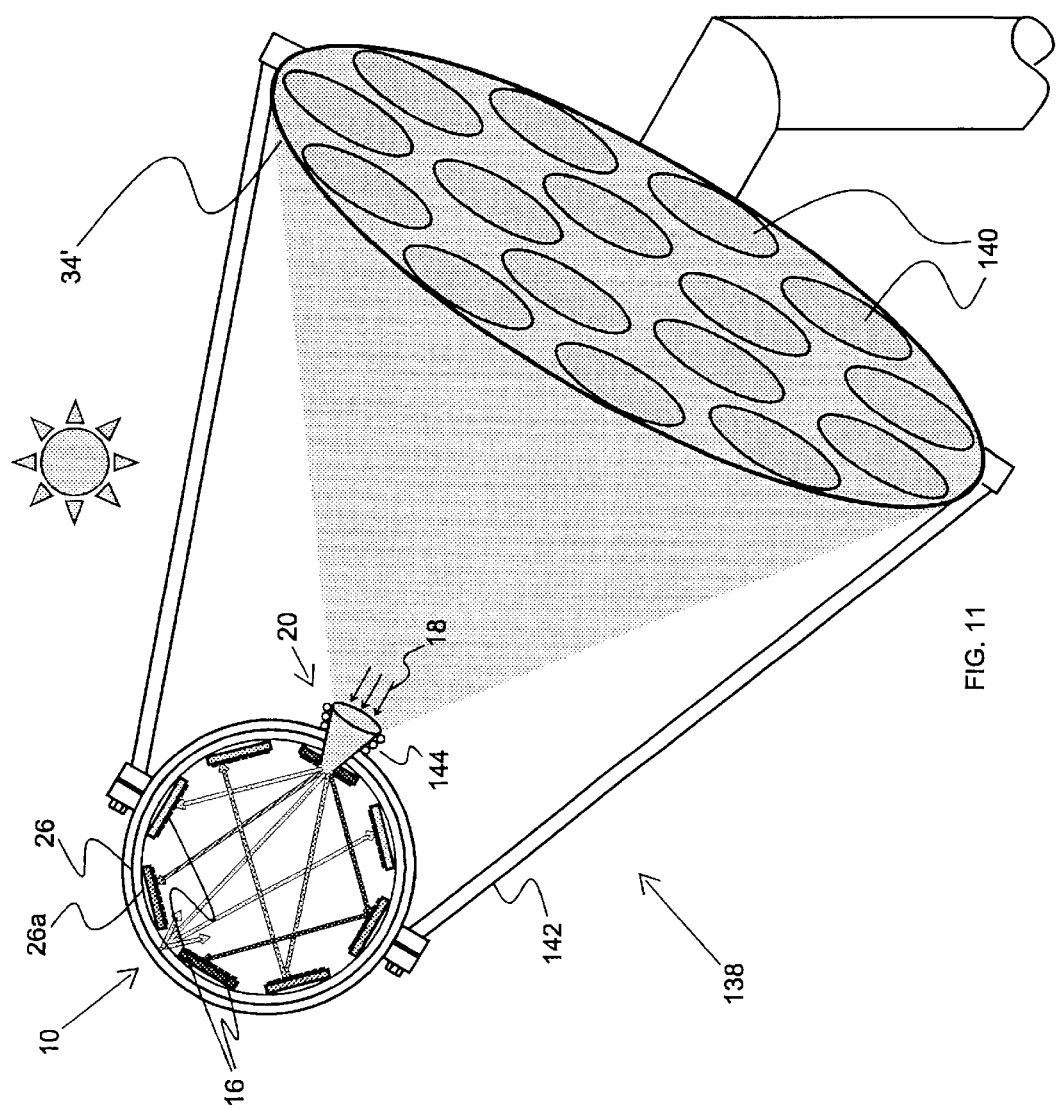
FIG. 11 is a schematic diagram, depicting an embodiment showing a combination of the PVCC with a concentrator dish and a secondary concentrator directly coupled to the cavity.

FIG. 11 shows a complete dish/PVCC system 138 where the cells 16 of the PVCC 10 are mounted on the cavity wall 26. A primary concentrator dish 34' provides a concentration ratio, on the order of 400× to 1,200×. The primary concentrator dish 34' comprises a plurality of independently adjustable mirror facets 140 for optimizing or adjusting the focal point. A secondary concentrator 20 provides a concentration ratio on the order of 16× to 50×. The overall concentration at the PVCC flux entrance 24 is about 20,000× for all choices of concentrations for the dish and the secondary concentrators. The PVCC 10 is maintained at a predetermined distance from the focal point of the primary concentrator dish 34' by at least three struts 142. Light 18 from the sun is concentrated by the primary concentrator dish 34' and enters the PVCC 10 through its solar flux port 24 from the second-stage concentrator 20, where an additional concentration of 16× to 50× takes place. Cooling coils 144 around the second-stage concentrator 20 provide additional cooling. The primary concentrator dish 34' is moveable by a two-axis tracking device (not shown) to track the sun both diurnally and seasonally.

INDUSTRIAL APPLICABILITY

The concentrating photovoltaic module is expected to find increasing use in terrestrial-based photovoltaic power systems.

Thus, there has been disclosed a concentrating photovoltaic module. It will be readily apparent to those skilled in this art that various changes and modifications of an obvious nature may be made, and all such changes and modifications are considered to fall within the scope of the present invention, as defined by the appended claims.

What is claimed is:

1. A concentrating photovoltaic module for providing a concentration in the range of about 500 to over 1,000 suns and a power generation capacity in a range of a few to 50 kiloWatts, said concentrating photovoltaic module comprising:

(a) a housing having a cavity of generally optimized closed shape inside said housing, said cavity having an internal surface area $A_s$ and including an opening for admitting pre-focused, direct solar radiation into said cavity, said opening having an entrance aperture area $A_i$ that is significantly smaller than $A_s$;

(b) a plurality of single junction solar cells within said cavity, at least some of said solar cells each having different energy bandgaps so that their spectral responses simultaneously fully span the solar spectrum; and (c) at least one wavelength filter associated with each solar cell, said at least one wavelength filter selected from the group consisting of Rugate filters and a combination of Rugate filters and stack interference filters, thereby providing selective transmission and reflection of incident solar radiation to assist in maximizing absorption of a region of said solar spectrum by solar cells having an appropriate bandgap.

2. The concentrating photovoltaic module of claim 1 comprising at least four groups of said solar cells.

3. The concentrating photovoltaic module of claim 2 wherein a first group of solar cells is receptive to a region of about 350 to 650 nm, a second group of solar cells is receptive to a region of about 650 to 850 nm, a third group of solar cells is receptive to a region of about 850 to 1150 nm, and a fourth group of solar cells is receptive to a region of about 1150 to 1800 nm.

4. The concentrating photovoltaic module of claim 3 wherein said first group of solar cells comprises gallium indium phosphide, said second group of solar cells comprises gallium arsenide, said third group of solar cells comprises indium gallium arsenide phosphide, and said fourth group of solar cells comprises indium gallium arsenide.

5. The concentrating photovoltaic module of claim 1 wherein each solar cell is a single junction cell, having a sun-receiving surface on which solar radiation is incident.

6. The concentrating photovoltaic module of claim 5 wherein each single junction solar cell is provided with said at least one wavelength filter on its sun-receiving surface, said at least one wavelength filter serving to screen said solar spectrum by selective transmission of photons into said cell and by selective reflection of photons from said cell.

7. The concentrating photovoltaic module of claim 6 wherein each wavelength filter is a Rugate interference filter comprising a plurality of layers, periodically continuously varying in refractive index according to a geometrical function.

8. The concentrating photovoltaic module of claim 1 further including a second-stage concentrator system for pre-focusing said solar radiation, secured to said opening.

9. The concentrating photovoltaic module of claim 8 wherein said second-stage concentrator includes inner surfaces that are mirrored.

10. The concentrating photovoltaic module of claim 9 wherein said second-stage concentrator has a Bezier optimized contour to provide a combination of maximum acceptance angle, maximum concentration, and minimum height.

11. The concentrating photovoltaic module of claim 1 wherein the ratio of $A_i$ to $A_s$ is 0.01 or less.

12. The concentrating photovoltaic module of claim 1 wherein all solar cells of a given bandgap are electrically connected together in series to form a string and each string is electrically connected in parallel to other strings of solar cells of other band-gaps.

13. The concentrating photovoltaic module of claim 12 wherein the strings of said solar cells of different bandgaps are voltage-matched.

14. The concentrating photovoltaic module of claim 1 wherein said cavity is provided with a coating having an average diffuse reflectivity of greater than 99% for the frequency range from 250 nm to 1800 nm.

15. The concentrating photovoltaic module of claim 14 wherein said coating comprises a material selected from the group consisting of sintered pigment-doped fluorinated long-chain addition polymers and barium sulfate.

16. The concentrating photovoltaic module of claim 1 further including a mechanism for cooling said solar cells.

17. The concentrating photovoltaic module of claim 16 wherein said cooling mechanism comprises a passive cooling system.

18. The concentrating photovoltaic module of claim 17 wherein said passive cooling system includes a heat sink and heat transfer apparatus for thermally transferring heat from said solar cells to said heat sink.

19. The concentrating photovoltaic module of claim 16 wherein said cooling mechanism comprises an active cooling system.

20. The concentrating photovoltaic module of claim 19 wherein said active cooling system includes a moving dielectric coolant thermally associated with said solar cells.

21. The concentrating photovoltaic module of claim 20 comprising a mechanism for circulating said dielectric coolant and a mechanism for cooling said dielectric coolant separate from said concentrating photovoltaic module.

22. The concentrating photovoltaic module of claim 20 including a mechanism for maintaining said moving dielectric coolant in thermal association with said solar cells.

23. A combination comprising a concentrator dish having a focus at an entrance aperture of a second-stage concentrator and said concentrating photovoltaic module of claim 1 located at said focus of said second-stage concentrator to receive concentrated solar radiation into said cavity.

24. The combination of claim 23 wherein said concentrator dish comprises a plurality of independently adjustable mirror facets for adjusting focal distance and focal image of said concentrator dish.

25. A power plant comprising a plurality of the concentrating photovoltaic modules of claim 1.

26. The power plant of claim 25 further including at least one heliostat and a plurality of concentrator dishes, each having a focus, associated lightwise with said at least one heliostat, with one said concentrating photovoltaic module associated with one concentrator dish, each concentrating photovoltaic module located at said focus of each concentrator dish to receive concentrated solar radiation into said cavity from said heliostat via said concentrator dish.

27. The concentrating photovoltaic module of claim 1 wherein said cavity is essentially spherical.

28. The concentrating photovoltaic module of claim 8 wherein said direct solar radiation is introduced into said second-stage concentrator by a first-stage reflecting concentrator.

* * * * *